United States Patent
Yanasak et al.

(10) Patent No.: US 8,134,363 B2
(45) Date of Patent: Mar. 13, 2012

(54) TEST OBJECT FOR USE WITH DIFFUSION MRI AND SYSTEM AND METHOD OF SYNTHESIZING COMPLEX DIFFUSIVE GEOMETRIES USING NOVEL GRADIENT DIRECTIONS

(75) Inventors: Nathan E. Yanasak, Crawfordville, GA (US); Tom C. Hu, Evans, GA (US)

(73) Assignee: Medical College of Georgia Research Institute, Inc., Augusta, GA (US)

( * ) Notice: Subject to any disclaimer, the term of this patent is extended or adjusted under 35 U.S.C. 154(b) by 324 days.

(21) Appl. No.: 12/220,172

(22) Filed: Jul. 21, 2008

(65) Prior Publication Data

US 2009/0058417 A1      Mar. 5, 2009

Related U.S. Application Data

(60) Provisional application No. 60/961,458, filed on Jul. 20, 2007, provisional application No. 61/126,458, filed on May 5, 2008, provisional application No. 61/011,165, filed on Jan. 16, 2008, provisional application No. 61/011,166, filed on Jan. 16, 2008.

(51) Int. Cl.
    *G01V 3/00* (2006.01)
(52) U.S. Cl. ........................... 324/307; 324/309
(58) Field of Classification Search .......... 324/300–322; 600/407–445
    See application file for complete search history.

(56) References Cited

U.S. PATENT DOCUMENTS

| | | | |
|---|---|---|---|
| 5,969,524 A | 10/1999 | Pierpaoli et al. | |
| 6,288,540 B1 | 9/2001 | Chen | |
| 6,549,803 B1 | 4/2003 | Raghavan et al. | |
| 6,591,004 B1 | 7/2003 | VanEssen et al. | |
| 6,686,736 B2 | 2/2004 | Schoen et al. | |
| 6,815,952 B1 | 11/2004 | Rose et al. | |
| 6,845,342 B1 | 1/2005 | Basser et al. | |
| 6,969,991 B2 | 11/2005 | Bammer et al. | |
| 6,972,565 B2 | 12/2005 | Yokoi et al. | |
| 6,992,484 B2 | 1/2006 | Frank | |
| 7,078,897 B2* | 7/2006 | Yablonskiy et al. | 324/307 |
| 7,330,026 B2 | 2/2008 | Wang et al. | |
| 7,346,382 B2 | 3/2008 | McIntyre et al. | |
| 7,355,403 B2* | 4/2008 | Chakraborty | 324/307 |
| 7,408,345 B2 | 8/2008 | Bammer et al. | |
| 7,409,035 B2 | 8/2008 | Kaufman et al. | |
| 7,411,393 B2 | 8/2008 | Zhang | |
| 7,529,422 B2 | 5/2009 | Wang et al. | |

(Continued)

OTHER PUBLICATIONS

Schott North America, Inc.; Components Enabling Biotechnology Research; www.us.schott.com; 2 pages; printed Feb. 11, 2011.

(Continued)

*Primary Examiner* — Brij B Shrivastav
(74) *Attorney, Agent, or Firm* — Gardner Groff Greenwald & Villanueva, PC

(57) ABSTRACT

A test object for use with diffusion MRI and a system and methods of synthesizing complex diffusive geometries. The test object, which includes anisotropic structures, can be used to monitor DTI measures by providing a baseline measurement. Using measurements of the phantom, data characteristic of more complicated diffusive behavior can be "synthesized", or composed of actual measurements re-arranged into a desired spatial distribution function describing diffusion. Unlike a typical DTI scan, the ADC measurements of the present invention are treated in a "reconstruction" phase as if the gradients were applied in different directions. Given a set of reconstruction directions, a judicious choice of acquisition directions for each reconstruction direction allows for the synthesis of any distribution.

20 Claims, 11 Drawing Sheets
(5 of 11 Drawing Sheet(s) Filed in Color)

U.S. PATENT DOCUMENTS

| | | | |
|---|---|---|---|
| 7,570,049 | B2 | 8/2009 | Lange |
| 7,643,863 | B2 * | 1/2010 | Basser et al. ............... 600/410 |
| 7,660,481 | B2 | 2/2010 | Schaap et al. |
| 7,775,980 | B2 | 8/2010 | Sumi |
| 7,834,627 | B2 | 11/2010 | Sakai et al. |
| 7,881,878 | B2 * | 2/2011 | Burrus et al. ............... 702/28 |
| 7,994,784 | B2 * | 8/2011 | Yanasak et al. ............... 324/307 |
| 2009/0058417 | A1 * | 3/2009 | Yanasak et al. ............... 324/307 |
| 2009/0190817 | A1 * | 7/2009 | Yanasak et al. ............... 382/131 |
| 2009/0267603 | A1 * | 10/2009 | Yanasak ............... 324/309 |
| 2010/0004527 | A1 | 1/2010 | Dale et al. |
| 2011/0074423 | A1 | 3/2011 | Krzyzak |

OTHER PUBLICATIONS

Alexander, Hasan, Lazar, Tsuruda, Parker, Analysis of Partial Volume Effects in Diffusion-Tensor MRI, Magnetic Resonance in Medicine, 2001, p. 770, vol. 45.

Anderson, Theoretical analysis of the effects of noise on diffusion tensor imaging, 2001, pp. 1174-1188, vol. 46, Magn Reson Med.

Ardekani, Selva, Sayer, Sinha, Quantitative Metrics for Evaluating Parallel Acquisition Techniques in Diffusion Tensor Imaging at 3 Tesla, Investigative Radiology, 2006, p. 806, vol. 41.

Assaf, Freidlin, Rohde, Basser, New Modeling and Experimental Framework to Characterize Hindered and Restricted Water Diffusion in Brain White Matter, Magnetic Resonance in Medicine, 2004, p. 965, vol. 52.

Bammer, Auer, Keeling, Augustin, Stables, Prokesch, et al., Diffusion tensor imaging using single-shot SENSE-EPI, 2002, pp. 128-136, vol. 48, Magn Reson Med.

Basser, Mattiello, Le Bihan, MR diffusion tensor spectroscopy and imaging, 1994, pp. 259-267, vol. 68, Biophys J.

Basser, Pajevic, Statistical artifacts in diffusion tensor MRI (DT-MRI) caused by background noise, 2000, pp. 41-50, vol. 44, Magn Reson Med.

Basser, Pierpaoli, Microstructural and physiological features of tissues elecidated by quantitative-diffusion-MRI tenso, 1996, pp. 209-219, vol. B111.

Bastin, Armitage, Marshall, A theoretical study of the effect of experimental noise on the measurement of anisotropy in diffusion imaging, 1998, pp. 773-785, Magn Reson Imaging.

Beaulieu, The basis of anisotropic water diffusion in the nervous system—a technical review, 2002, pp. 435-455, vol. 15, NMR Biomed.

Caan, De Vries, Khedoe, Akkerman, Van Vliet, Grimberger, Vos, Generating fiber crossing phantoms out of experimental DWIs, in Proceedings of the 2007 Medical Image Computing and Computer-Assisted Intervention (MICCAI) Conference, 2007.

Chang, Koay, Pierpaoli, Basser, Variance of estimated DTI-derived parameters via first-order perturbation methods, 2007, pp. 141-149, vol. 57, Magn Reson Med.

Chen, Hsu, Noise removal in magnetic resonance diffusion tensor imaging, 2005, pp. 393-407, vol. 54, Magn Reson Med.

Chen. B et al, Neuroimage, 2006, pp. 12-129, vol. 30.

Chung, Lu, Henry, Comparison of bootstrap approaches for estimation of uncertainties of DTI parameters, 2006, pp. 531-541, vol. 33, Neuroimage.

Cook, Bai, Hall, Nedjati-Gilani, Seunarine, Alexandcer, Camino: Diffusion MRI reconstruction and processing, Cetre for Medical Image Computing, Department of Computer Science, University College London, UK.

Cook, Bai, Nedjati-Bilani, Seunarine, Hall, Parker, Alexander, in Proceedings of the 14th Scientific Meeting of the ISMRM (2006), p. 2759, abstract #.

Dice, Measure of the Amount of Ecologic Association Between Species, Ecology, 1945, p. 297, vol. 25.

Dietrich, Heiland, Sartor, Noise correction for the exact determination of apparent diffustion coefficient at low SNR, 20001, pp. 448-453, vol. 45, Magn Reson Med.

Ding, Gore, Anderson, Reduction of noise in diffusion tensor images using anisotropic smoothing, 2005, pp. 485-490, vol. 53, Magn Reson Med.

Facon, Ozanne, Fillard, Tournoux-Facon, American Journal of Neuroradiology, 2007, p. 411, vol. 28.

Fieremans, Deene, Delputte, Ozeemir, Achten, Lemahieu, The design of anisotropic diffusion phantoms for the validation of diffusion weighted magnetic resonance imaging, 2008, vol. 53.

Griswold, Jakob, Heidemann, Nittka, Jellus, Wang, Kiefer, Hasse, Generalized Autocalibrating Partially Parallel Acquisitions (GRAPPA), Magnetic Resonance in Medicine, 2002, p. 1201, vol. 47.

Gudbjartsson, Patz, The Rician distribution of noisy MRI data, 1995, pp. 910-914, vol. 34, Magn Reson Med.

Hagemen et al., 3rd IEEE international symposium on biomedical imaging: macro to nano, 2006, pp. 798-801.

Hagmann, DTI mapping of human brain connectivity: statistical fire tracking and virtual dissection, 2003, pp. 545-554, vol. 19, Neuroimage.

Hasan, Parker, Alexander, Magnetic Resonance Water Self-Diffusion Tensor Encoding Optimization Methods for Full Brain Acquisition, Image Analysis and Stereology, 2002, p. 87, vol. 21.

Horsfield, Jones, Applications of diffusion-weighted and diffusion tensor MRI to white matter diseases: a review, 2002, pp. 570-577, vol. 15, NMR Biomed.

Horsfield, Using diffusion-weighted MRI in multicenter clinical trials for multiple sclerosis, 2001, pp. S51-S54, vol. 186, J Neurol.

Jellison, Field, Medow, Lazar, Salamat, Alexander, Diffusion Tensor Imaging of Cerebral White Matter: A Pictorial Review of Physics, Fiber Tract Anatomy, and Tumor Imaging Patterns, American Journal of Neuroradiology, 2004, pp. 356, vol. 25.

Jenkinson, A fast, automated, n-dimensional phase unwrapping algorith, Magnetic Resonance in Medicine, 2003, pp. 193-197, vol. 49.

Jones, Basser, "Squashing peanuts and smashing pumpkins": how noise distorts diffusion-weighted MR data, 2004, pp. 979-993, vol. 52, Magn Reson Med.

Koay, Chang, Carew, Pierpaoli, Basser, A unifying theoretical and algorithmic framework for least squares methods of estimation in diffusion tensor imaging, Journal of Magnetic Resonance, 2006, p. 115, vol. 182.

Landman, Farrell, Jones, Smith, Prince, Mori, Effects of diffusion weighting schemes on the reporucibility of DTI-derived fractional anisopy, mean diffusivity, and principle eigenvector measurements 1.5T, NeuroImage, 2007, p. 1123, vol. 36.

Le Bihan, Breton, Lallemand, Grenier, Cabanis, Laval-Jeanet, MR imaging of intravoxel incoherent motions: application to diffusion and perfusion in neurologic disorders. 1986, pp. 401-407, vol. 161, Radiology.

Le Bihan, Mangin, Poupon, Calrk, Pappata, Molkko, et al., Diffusion tensor imaging: concepts and applications, 2001, pp. 534-546, vol. 13, J Magn Reson Imaging.

Lin, Validation of Diffusion Tensor Magnetic Resonance Axonal Fiber Imaging with Registered Manganes-Enhanced Optic Tracts, NeuroImage, 2001, pp. 1035, vol. 14.

Mori, Frederiksen, Van Zijl, Stieltjes, Kraut, Solaiyappan, et al., Brain white matter anatomy of tumor patients evaluated with diffusion tensor imaging, 2002, pp. 377-380, vol. 51, Ann Neurol.

Pagani, Bammer, Horsfiel, Rovaris, Gass, Ciccarelli, Filippi, Diffusion MR Imaging in Mulltiple Sclerosis: Technical Aspects and Challenges, American Journal of Neuroradiology, 2007, pp. 411, vol. 28.

Panin et al., Phys Med Biol, 2002, pp. 2737-2757, vol. 47.

Parker, Schnabel, Symms, Wehring, Barker, Nonlinear smoothing for reduction of systematic and random errors in diffusion tensor imaging, 2000, pp. 702-710, vol. 11, J Magn Reson Imaging.

Peled et al., Mag Reson Imaging, 2004, pp. 1263-1270, vol. 24.

Pierpaoli, Basser, Toward a quantitative assessment of diffusion anisotropy, 1996, pp. 893-906, vol. 36, Magn Reson Med.

Poupon, Perrin, Rieul, Mangin, Bihan, Validation of Q-Ball imaging with a diffusion fiber crossing phantom on a clinical scanner, poster presentation at the ISMRM Workshop on Methods for Quantitative Diffusion MRI of Human Brain, 2005.

Poupon, Rieul, Kezele, Perrin, Poupon, Mangin, New diffusion phantoms dedicated to the study and validation of high-angular resolution diffusion imaging (hardi) models, 2005, Magnetic Resonance in Medicine, vol. 60.

Pruessmann, Weiger, Scheidegger, Boesing, Sense: sensitivy encoding for fast MRI, pp. 952-962, vol. 42, Magn Reson Med.

Schluter et al., Proc SPIE—The Intl Soc for Optical Engg., 2005, pp. 835-844, vol. 5746.

Skare, Li, Nordell, Ingvar, Noise considerations in the determination of diffusion tensor anistropy, 2000, p. 659-669, vol. 18, Magn Reson Imaging.

Stejskal, Tanner, Spin Diffusion Measurements, Journal of Chemical Physiscs, 1965, p. 488, vol. 41.

Sullivan, Pfefferbaum, Diffusion tensor imaging in normal aging and neuropsychiatric disorder, 2003, p. 244-255, vol. 45, Eur J Radiol.

Sundgren, Dong, Gomez-Hassan, Mukherji, Maly, Welsh, Diffusion tensor imaging of the brain: review of clinical applications, 2004, pp. 339-350, vol. 46, Neuroradiology.

Taouli, Martin, Qayyum, Merrimand, Vigernon, Yeh, Coakley, Parallel Imaging and Diffusion Tensor Imaging for Diffusion-Weighted MRI of the Liver: Preliminary Experience in Healthy Volunteers, American Journal of Neuroradiology, 2004, p. 677, vol. 183.

Thoeny, Dekeyzer, Oyen, Peeters, Diffusion-weighted MR Imaging of Kidneys in Healthy Volunteers and Patients with Parenchymal Diseases: Initial Experience, Raidology, 2005, pp. 911, vol. 235.

Tuch et al., Neuron, 2003, pp. 885-895, vol. 40.

Tuch, Reese, Wiegell, Makris, Belliveau, Wedeen, High Angular Resolution Diffusion Imaging Reveals Intravoxel White Matter Fiber Heterogeneity, Magnetic Resonance in Medicine, 2022, p. 577, vol. 48.

Von Dem Hagen, Henkelman, Magn. Reson. Med., 2002, p. 454, vol. 48.

Yanasak, Allison, Use of capillaries in the construction of an MRI phantom for assessment of diffusion tensor imaging: demonstration of performance, 2006, pp. 1349-1361, vol. 24, Magn Reson Imaging.

Zhuang J. et al., J Magn Reson Imag., 2004, pp. 1263-1270, vol. 24.

Zou, Warfield, Bharatha, Tempany, Kaus, Haker, Wells, Jelesz, Kikinis, Statistical Validation of Image Segmentation Quality Based on a Spatial Overlap Index; Academic Radiology, 2004, p. 178, vol. 11.

* cited by examiner

US 8,134,363 B2

TEST OBJECT FOR USE WITH DIFFUSION MRI AND SYSTEM AND METHOD OF SYNTHESIZING COMPLEX DIFFUSIVE GEOMETRIES USING NOVEL GRADIENT DIRECTIONS

CROSS-REFERENCE TO RELATED APPLICATIONS

This application claims the benefit of U.S. Provisional Patent Application Ser. Nos. 60/961,458 filed on Jul. 20, 2007; 61/126,458 filed on May 5, 2008; 61/011,165 filed on Jan. 16, 2008; and 61/011,166 filed on Jan. 16, 2008, which applications are all incorporated herein by reference in their entireties for all purposes.

TECHNICAL FIELD

The present invention relates generally to the field of medical imaging, and particularly to systems and methods of synthesizing complex diffusive geometries with diffusion MRI and diffusion tensor imaging (DTI).

BACKGROUND OF THE INVENTION

Diffusion tensor imaging (DTI) is an MRI-based technique with great potential to enhance clinical diagnosis of pathology in structured tissue. In particular, DTI has shown promise in the area of neurological disease, exhibiting some sensitivity to identifying white-matter tumor extent, sclerotic lesions, and compression trauma in spine. In clinical research, DTI has been used to map white matter fiber trajectories in the brain. Other pathology that may be favorably characterized with DTI includes liver and renal diseases.

Despite its utility, the routine diagnostic application of DTI remains in its infancy. Reasons for this include that, considering the large amount of information that DTI provides as compared to an ordinary MR sequence, the clinical adoption of standardized protocols is lagging. During a DTI sequence, a series of images are generated by applying gradient magnetic fields along particular directions, to measure the directional dependence of diffusion. DTI reduces this series of measurements to a tensor at every image location, with each eigenvalue and eigenvector representing the apparent diffusion coefficient (ADC) values along principle axes of an ellipsoid. Precision of the measurements depends on the number of directions sampled and the choice of particular direction schemes. Furthermore, DTI measurements characterize tissue properties indirectly, including cellular size, orientation, heterogeneity, and cell permeability. Uncertainty persists in the understanding of how DTI measures correlate with these tissue characteristics and how they change with disease.

Procedures for quality assurance (QA) and for estimation/measurement of systematic uncertainty have yet to be developed for DTI. In comparison with a single intensity value per voxel measured using a $T_1$-weighted MR sequence, the end-product of a DTI series is six values to define a tensor within a given reference frame, where the frame is defined by three orthogonal vectors. As expected, the effect of noise on DTI data is more complicated than for routine clinical images, leading to a systematic bias that depends on SNR (signal to noise ratio). In an effort to eliminate image distortion inherent to the echo-planar imaging sequences predominantly used in the clinic and to migrate to higher-resolution imaging, parallel imaging has been incorporated with DTI. Unfortunately, while the array coils necessary for parallel MR scanning systems show improved SNR overall, their use changes the spatial properties of the noise distribution over the image. This effect of non-uniformity in the spatial sensitivity of surface coils is enhanced further using parallel imaging, leading to regions where noise may be higher or have variable spatial correlation, decreasing sensitivity within these regions.

Another complication with DTI QA procedures is the lack of a suitable test object, to evaluate and correct systematic bias. Diffusion depends on temperature, so thermal stability of such objects can also be important. Therefore, there exists a need in the industry for a suitable test object to evaluate and correct systematic bias for DTI imaging, methods for quality assurance, and methods for estimation/measurement of systematic uncertainty.

SUMMARY OF THE INVENTION

In a first form, the present invention provides a phantom, or a test object, which includes anisotropic structures, which can be used to monitor DTI measures. The anisotropic structures include a plurality of water-filled capillaries, arranged in a predefined configuration.

In addition to using the phantom for providing quality assurance (QA) measurements of DTI in a conventional manner, data scanned using a phantom of the present invention having simple, prolate geometry can be employed to synthesize ADC distributions that exhibit complicated behavior. The method of the present invention may be used for studying anatomically realistic diffusive behavior in tissue.

Unlike a typical DTI scan, the ADC measurements of the present invention are treated in a "reconstruction" phase as if the gradients were applied in different directions. If diffusion gradients are applied along particular directions, but the tensors are calculated assuming that the gradients were applied along different directions, the ADC distribution is modified and the associated tensor shape is modified. Following this method, the ADC values derived from a real-world distribution can be rearranged into a distribution of choice. Given a set of reconstruction directions, a judicious choice of acquisition directions for each reconstruction direction allows for the synthesis of any distribution.

These and other aspects, features and advantages of the invention will be understood with reference to the drawing figures and detailed description herein, and will be realized by means of the various elements and combinations particularly pointed out in the appended claims. It is to be understood that both the foregoing general description and the following brief description of the drawings and detailed description of the invention are exemplary and explanatory of preferred embodiments of the invention, and are not restrictive of the invention, as claimed.

BRIEF DESCRIPTION OF THE DRAWINGS

The patent or application file contains at least one drawing executed in color. Copies of this patent or patent application publication with color drawings(s) will be provided by the Office upon request and payment of the necessary fee.

DETAILED DESCRIPTION OF EXAMPLE EMBODIMENTS

The present invention may be understood more readily by reference to the following detailed description of the invention taken in connection with the accompanying drawing figures, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. Ranges may be expressed herein as from "about" or "approximately" one particular value and/or to "about" or "approximately" another particular value. When such a range is expressed, another embodiment includes from the one particular value and/or to the other particular value. Similarly, when values are expressed as approximations, by use of the antecedent "about," it will be understood that the particular value forms another embodiment.

The present invention provides a system and method for providing quality assurance of ADC ("apparent diffusion coefficient") values obtained when scanning an object, such as tissue of a human or animal subject, with a DTI sequence of an MRI scanner. Additionally, the present invention also provides a phantom or test object that can be scanned by an MRI using a DTI (or other) sequence to provide a baseline reading for DTI analysis of tissue of a human or animal subject. Accordingly, once a baseline is obtained, a practitioner can employ one or more methods of the present invention to scan tissue of a human or animal subject to determine anomalies in the tissue.

Phantom Examples

Figure 1:
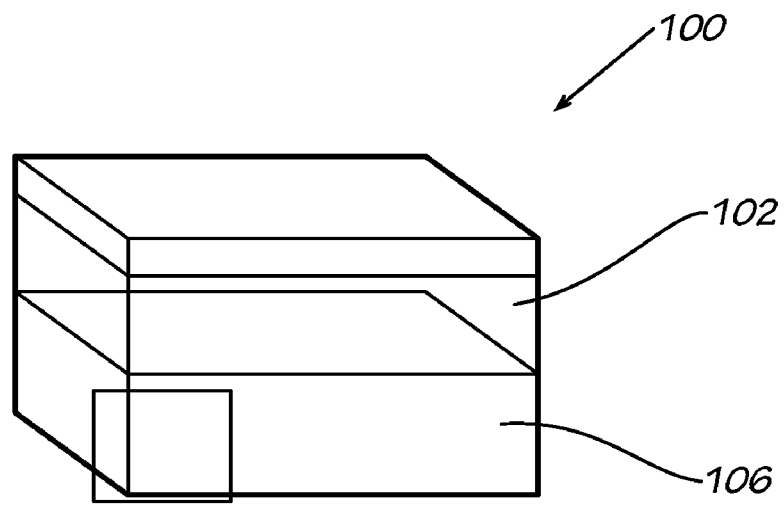
FIG. 1 depicts a perspective view of a phantom for use with DTI imaging according to a first example embodiment.
Figure 2:
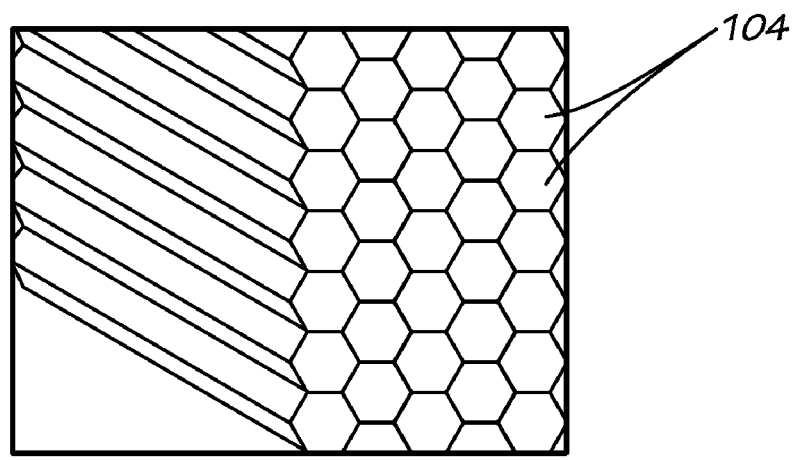
FIG. 2 depicts a detailed view of a portion of the phantom of FIG. 1.

The present invention provides example phantoms or test objects that can be scanned to provide a baseline reading (i.e., a mathematical model) for DTI analysis of tissue of a human or animal subject. As shown in FIGS. 1 and 2, in a first example embodiment, the phantom 100 includes a housing 102 that contains an assembly of a plurality of capillary arrays 104 therein, with each capillary array closely abutting adjacent capillary arrays in a tessellated arrangement. Together, the plurality of capillary arrays 104 forms a macro-array 106. Hereafter, any larger-scale assembly of capillary arrays shall be referred to as a "macro-array". As shown, each capillary array 104 is hexagonal in shape. The hexagonal shapes of the capillary arrays 104 within the housing 102 facilitate stacking of the capillary arrays into the macro-array 106, which as shown in FIG. 1 is generally rectangular in appearance and conforms to the shape of housing 102. However, those skilled in the art will understand that the capillary arrays can be any suitable size or shape, such as trapezoidal, triangular, octagonal, rectangular, etc.

Figure 3:
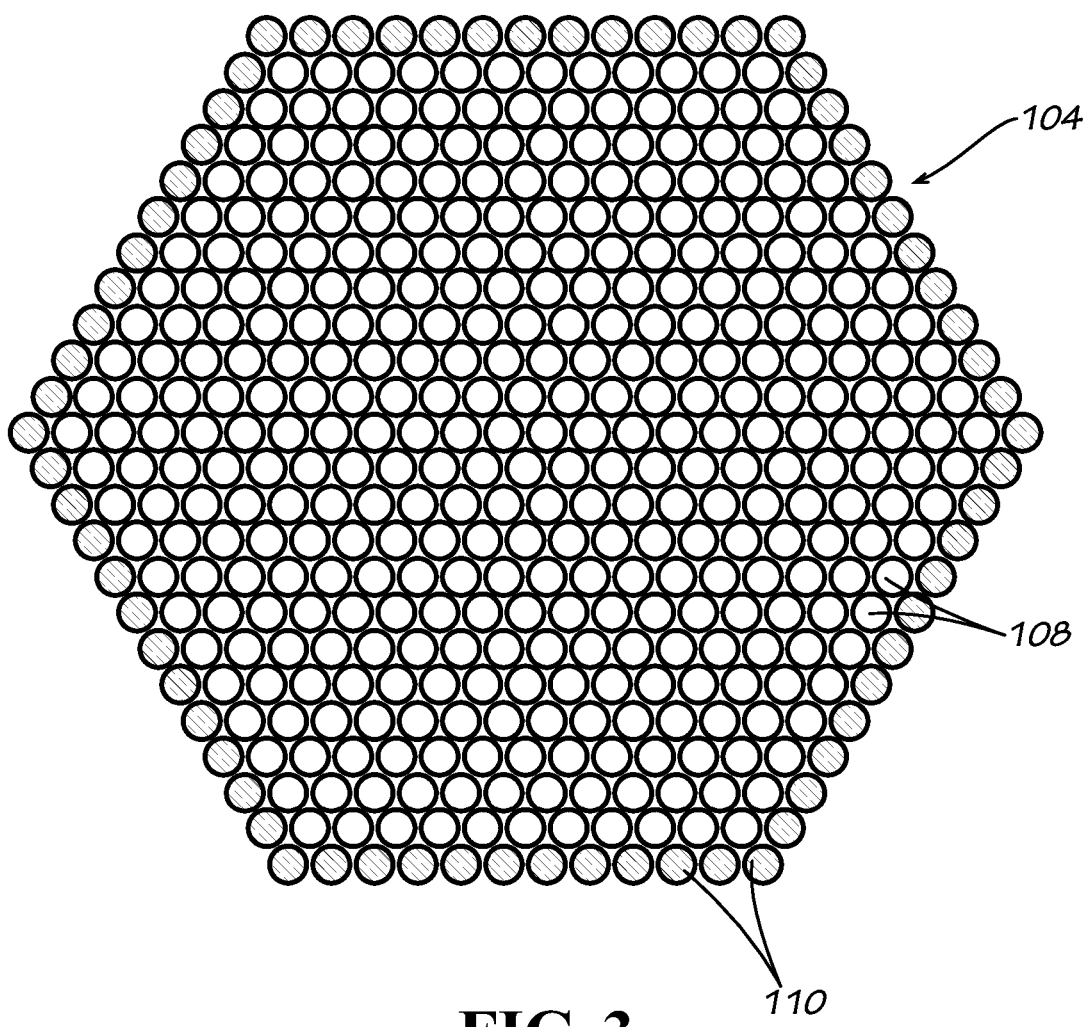
FIG. 3 depicts a sectional view of one capillary array in FIG. 2.

Preferably, each capillary array 104 includes a plurality of glass capillaries 108 therein, as shown in FIG. 3. In a typical example embodiment, glass capillaries 108 are used because they are generally easier to manufacture with high-precision diameters. Additionally, the formulation of glass can be such that its magnetic susceptibility can be closely matched to that of water. However, those skilled in the art will understand that other suitable materials, such as plastics, can be used for the capillaries 108. In a typical example embodiment, each capillary's internal diameter is between about 10 and 90 microns and more preferably between about 20 and 82 microns. Preferably, all of the capillaries 108 are completely filled with water, although in alternative embodiments, the capillaries can be substantially or partially filled with water. Optionally, each capillary can include an amount of a suitable contrast dopant. An exemplary capillary array 104 is a hexagonal capillary array having 397 capillaries 108 and 1470 interstitial pores of lesser volume with the whole array bounded by a layer of solid glass rods 110, as manufactured by Schott North America, Inc. (Southbridge, Mass.) and shown in FIG. 3. Preferably, the diameter of each glass rod 110 is equal to or substantially equal to the diameter of each capillary 108. Also preferably, the capillaries 108 and the glass rods 110 are in a close-packed hexagonal arrangement. Those skilled in the art will understand that other suitable capillary arrays of other sizes and shapes can be employed as well.

Referring back to FIG. 1, the housing 102 can be constructed from any suitable material having a magnetic susceptibility that can be somewhat matched to that of water. Exemplary materials include polypropylene, polyethylene, glass, and PMMA, although those skilled in the art will understand that other suitable materials can be employed as well. In the depicted embodiment, the housing 102 has a substantially box-like shape measuring about one inch by about one inch by about one inch, although those skilled in the art will understand that such dimensions are exemplary and can vary and that any suitable size and shape of housing can be used. For example in an alternative embodiment, a cylindrical housing with a screwtop lid can be employed.

The plurality of capillary arrays 104 can be bound together into the macro-array 106 with a water absorbent material, such as cotton string (not shown for purposes of clarity). In alternative embodiments, the capillary arrays 104 can be held together with a somewhat of an interference fit (such as a mechanical or pressure fit) if the housing is only slightly larger than the macro-array, thereby providing a mechanical force against the macro-array. Those skilled in the art will understand that other suitable devices and techniques can be used to secure the capillary arrays 104 together and/or secure the macro-array within the housing so as to prevent the macro-array from moving while the phantom 100 is scanned.

As shown in FIG. 1 in the first example embodiment, all of the hexagonal capillary arrays 104 are aligned in the same direction and stacked on top of each other in the housing 102. The bottom row of capillary arrays 104 (i.e., the row of capillary arrays at the base of the housing) includes a series of voids 112 (or channels) between adjacent arrays. Similarly (and though not shown in the drawings for purposes of clarity), the top row of arrays 104 (i.e., the row of capillary arrays near the top or lid of the housing) includes a similar series of voids (or channels) between adjacent arrays. Alternatively, the top and bottom rows of arrays can include alternating hexagonal arrays and trapezoidal (i.e., "half-hexagonal") arrays that abut each other so as to create a hexagonal pattern with minimal or no space between adjacent arrays or between the arrays and the base of the housing. In another alternative form, instead of hexagonal arrays, all of the arrays can be trapezoidal, thereby providing an arrangement without the voids of FIG. 1.

In a typical example embodiment, there are generally enough capillary arrays 104 to fill or substantially fill the housing 102. A sufficient amount of water (such as distilled water) is placed inside of the housing and hence fills any voids between the arrays and between the arrays and the housing. In alternative embodiments, the macroarray of capillary arrays 104 fill only a portion of the housing 102. In such an embodiment, it may be advantageous to place a weight, such as a water-saturated piece of material (such as cotton) or fabric, on the macro-array 106 so as to keep the capillary arrays 104 in a tightly stacked configuration. However, when hexagonal or trapezoidal capillary arrays 104 are used, there is a natural tendency for the macro-arrays to stack in a tight configuration in shape.

The phantom 100 can be scanned with an MRI using a DTI sequence of the present invention to image the prolate ADC distributions in a region of interest ("ROI") containing the capillaries 108. Data from scans of the phantom 100 in this configuration can then be used to synthesize other distributions.

Figure 4:
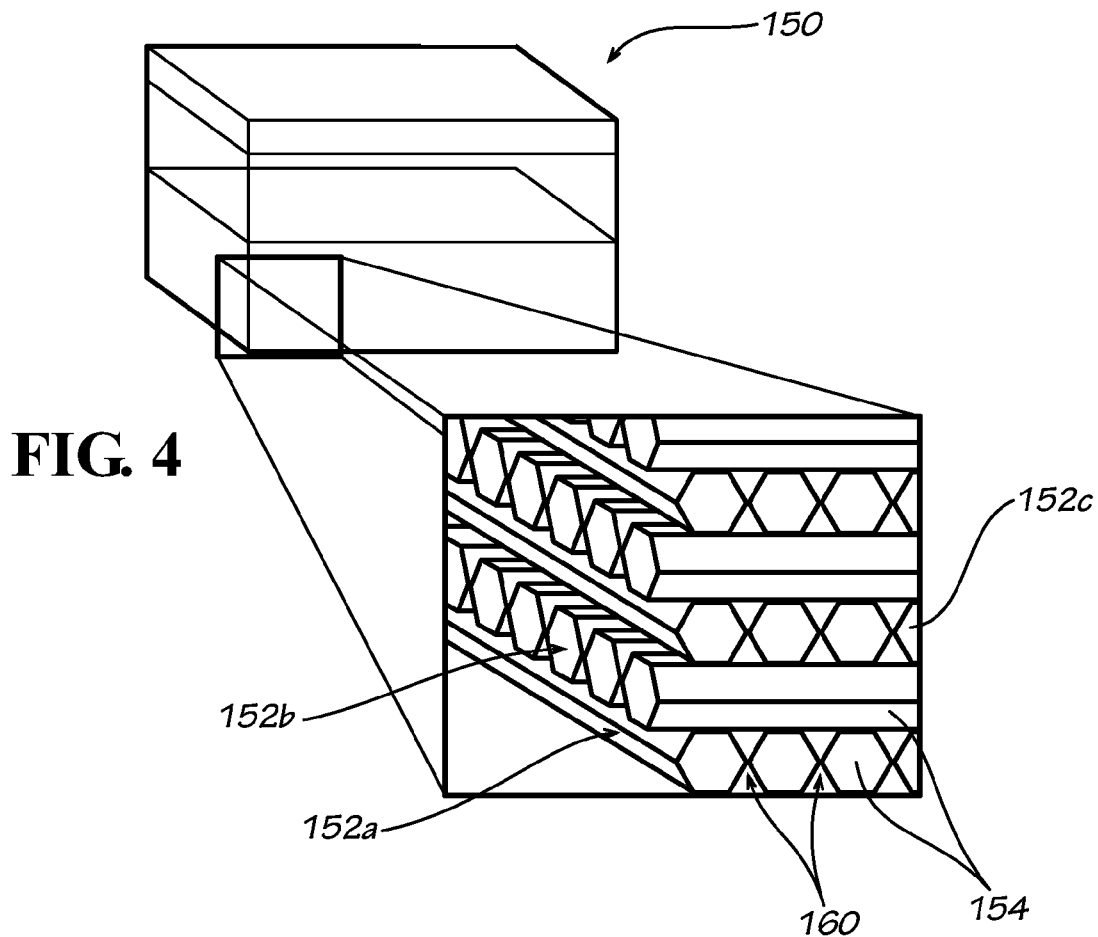
FIG. 4 depicts a perspective view of a phantom for use with DTI imaging according to a second example embodiment.

A second example embodiment of a phantom 150 is shown in FIG. 4. The phantom 150 is substantially similar to the phantom 100, but with the exceptions noted herein. Preferably, each row 152a-152n or layer of the capillary arrays 154 is rotated 90° relative to the previous layer, thereby creating alternating rows of arrays, as generally shown in FIG. 4. In other words, the capillary axes of each row are generally perpendicular to the two adjacent rows. As such, the phantom 150 generally behaves as a two-tensor diffusion distribution because of volume averaging of the crossing capillary layers. The data from the phantom 150 of this configuration can be used to confirm the general shape of a two-tensor diffusion distribution.

Notably, this stacking pattern of capillary arrays 154 in the phantom 150 allows more water to be located outside of the arrays, as shown by arrows 160. For example, the water 160 located outside of the arrays 154 can be approximately 40% by water volume. Because of the increase in water external to the arrays 154 (as compared to the phantom 100 of FIG. 1), higher ADC values in all directions and lower anisotropy can be expected.

In an alternative embodiment, the shapes of the arrays 154 can be trapezoidal. With such construction of rows rotated 90° relative to adjacent rows, flat layers of arrays can be built with alternating layers of capillaries (with fewer voids than that of FIG. 4), where the capillaries in each matrix (or row) can point to an arbitrary angle to other planes. Accordingly, the ADC values remain close to the same per plane of trapezoidal arrays.

Figure 5:
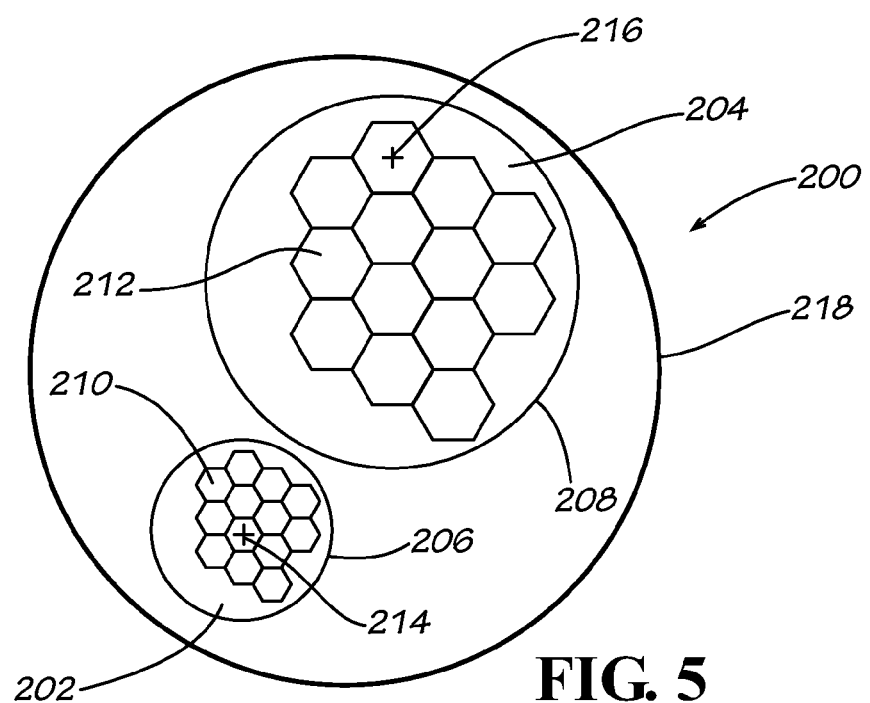
FIG. 5 depicts a sectional view of a phantom for use with DTI imaging according to a third example embodiment.

A third example embodiment of a phantom 200 is shown in FIG. 5. The phantom 200 includes two arrays 202, 204 of water-filled capillaries, each housed within an undoped water-filled glass housing 206, 208 such as a glass vial. Together the two arrays 202, 204 form a macro-array. The first array 202 has thirteen water-filled capillary arrays 210 bound together, with each capillary in the capillary array having an inner diameter of approximately 23 μm. The approximate diameter of the first array 202 is thus 4 mm. The second array 204 has thirteen water-filled capillary arrays 212 bound together, with each capillary in the capillary array having an inner diameter of approximately 83 μm. The approximate diameter of the second array 204 is thus 8 mm. One standard deviation (S.D.) of error in measuring these diameters is equal to about 2 μm. Both the first and second arrays 202, 204 are approximately 8-10 mm in length. Preferably, the capillary axes 214, 216 for both arrays 202, 204 are oriented approximately normal to the axial image plane. Preferably, the first and second arrays 202, 204 are bound together such as with a cotton string.

Prior to imaging, the glass housings 206, 208 can be placed into a single water-filled container 218, such as an approximately 0.6 liter polypropylene container although other suitable containers can be used. Accordingly, the phantom 200 can accommodate voxel sizes typical of a clinical procedure (i.e., approximately 1-10 $mm^3$) and can be used to study the effect of SNR on DTI eigenvalues using a clinical MRI scanner. Both arrays 202, 204 can be imaged in at least one 2D axial plane of approximately 3 mm thickness.

Optionally, the water in the housings 206, 208 and/or the container 218 can be lightly doped with a suitable contrast dopant, such as copper sulfate (CuSO4), Gd-DPDT, or heavy water, to allow for shorter TR and/or TE, to alter the signal intensity, and to decrease sequence duration. The phantom 200 can be employed to examine the effect of iteration on sorting procedures. Additionally, heavy water may provide certain additional advantages over other contrast dopants. Heavy water has virtually the same properties as normal water, with the exception that the hydrogen nucleus is heavy water contains an extra neutron. So, heavy water diffuses at approximately the same rate and has approximately the same magnetic susceptibility as normal water, but heavy water is not visible using a standard MRI sequence. So, in a compartment having a mixture of equal parts of normal water and heavy water, the image of that compartment will be about 50% the signal (and SNR) of that of a compartment of normal water. Accordingly, the SNR can be adjusted without adjusting the $T_1$ or $T_2$ relaxation.

Figure 6:
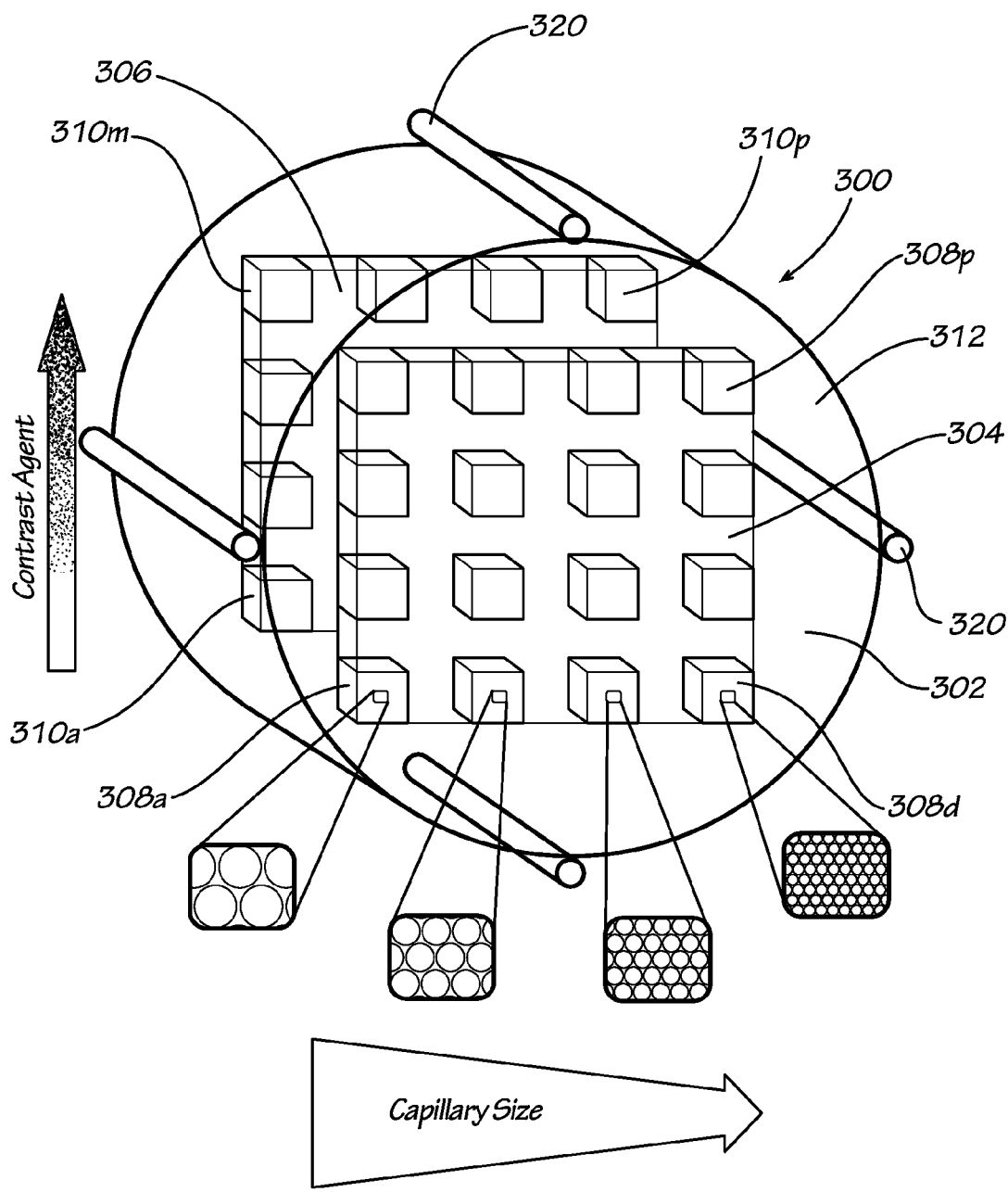
FIG. 6 depicts a perspective view of a phantom for use with DTI imaging and showing a detailed view of a portion of the arrangement of macro-arrays according to a fourth example embodiment.
Figure 7:
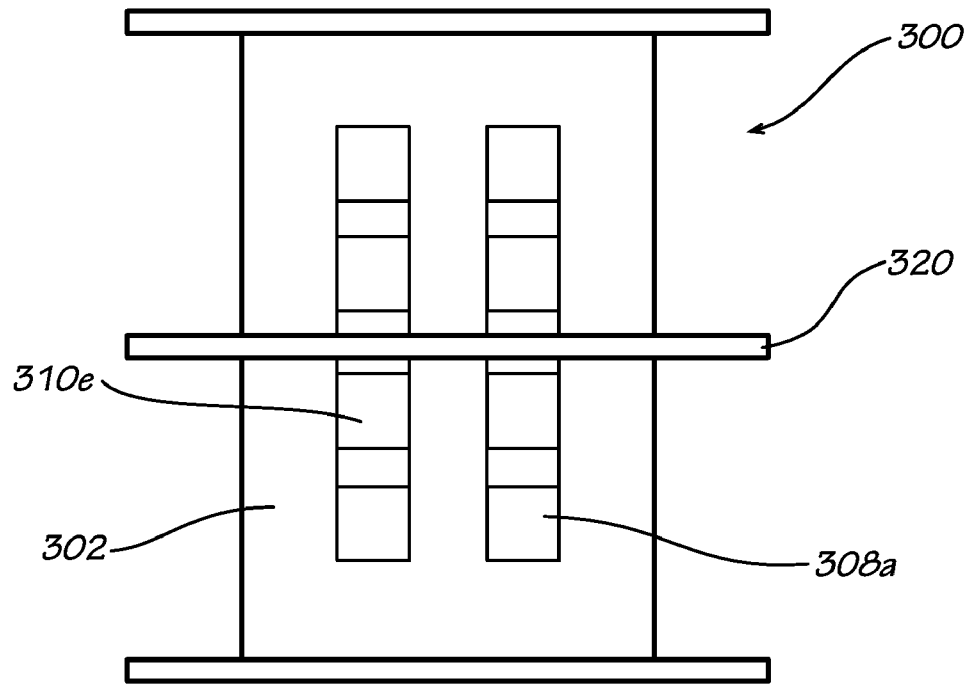
FIG. 7 depicts a side view of the phantom of FIG. 6.
Figure 8:
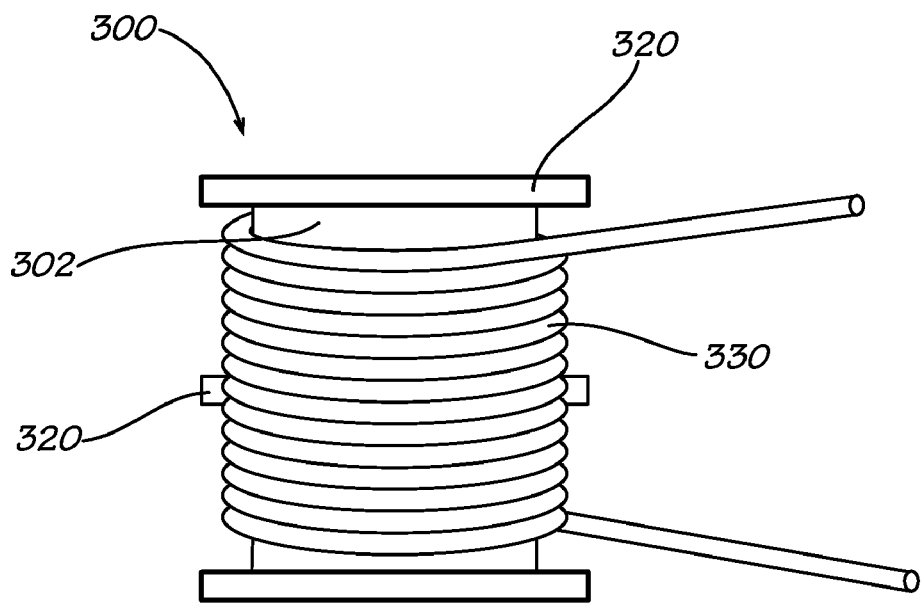
FIG. 8 depicts a side view of the phantom of FIG. 6 and shown wrapped with thermal tubing.

A fourth example embodiment of a phantom 300 is shown in FIGS. 6-8. Advantageously, the phantom 300 includes a variety of different sized structures so as to produce an initial range of eigenvalues, from the differences in diffusion properties arising from the structures in each compartment. An initial range of SNR values can be specified by the use of a contrast dopant to increase or decrease the image intensity.

The phantom 300 includes a water-filled housing 302. Preferably, the housing 302 is permanently sealed such that the water cannot escape the housing. Alternatively, the housing 302 can include a removable lid with a watertight seal. In the depicted embodiment, the housing 302 has a generally cylindrical shape, although those skilled in the art will understand that other suitable shapes for the housing can be employed as well. In a typical example embodiment, the size and shape of the housing 302 approximates the size and shape of a human head or brain. For example, the diameter can be between approximately 8-12 inches in diameter and the length can be about 5-6 inches. Those skilled in the art will understand that such dimensions are exemplary and can vary in other embodiments. The housing 302 can be constructed of any suitable material such as, but not limited to, polypropylene, polyethylene, PMMA, or glass.

The housing 302 encases a plurality of matrices of discrete compartments. In the depicted embodiment, the housing 302 encases two matrices 304, 306 of compartments, each having sixteen discrete and spaced-apart compartments 308a-308p, 310a-310p, although those skilled in the art will understand that only one or a plurality of matrices can be employed and that fewer or additional compartments can be used. In a typical example embodiment, the compartments 308a-308p, 310a-310p are generally cubical in shape and measuring about one cubic inch, although those skilled in the art will understand that such shape is not critical and that any suitable sized and shaped compartment can be used. Adjacent compartments can be spaced about one inch apart, while in an alternative embodiment, adjacent compartments can closely abut each other.

The first matrix 304 includes sixteen compartments 308a-308p, namely four rows by four columns of compartments. Each compartment 308a-308p is preferably spaced apart from the others and secured to a wall of the housing 302. As depicted, the compartments 308a-308p are attached to the inner face of the cylindrical housing 302. Alternatively, each compartment 308a-308p can be attached to a disk-like plate that is secured within the housing 302.

Each compartment 308a-308p encases a single macro-array of a plurality of capillary arrays having capillaries of a single inner diameter, but each column of compartments preferably includes capillaries having differing inner diameters. The configurations of the arrays are substantially similar to that of FIGS. 1-4, with the notable difference being the size of the individual capillaries. Preferably, all of the arrays are aligned in each compartment 308a-308p such that the capillary axes point in the longitudinal axis of the cylinder. Alternatively, the stacking pattern of capillary arrays as shown in FIG. 2 can be employed.

The first column includes capillaries of a first diameter; the second column includes capillaries of a second diameter (which is different than the first); the third column includes capillaries of a third diameter (which is different than the first and second); and the fourth column includes capillaries of a fourth diameter (which is different than the first, second, and third). Preferably, the various compartments in a row span a reasonable range of diameters that is clinically relevant. Accordingly, the change in diameter size depends, in part, on the number of compartments and the range spanned. Assuming a range of approximately 20 to 80 microns (which is a clinically relevant range) and four compartments, the inner diameters of the capillaries of the arrays of the four columns are 82, 51, 32, and 20 microns, respectively. Thus, the size of the capillaries varies by about 60% between adjacent compartments. Accordingly, such arrangement of compartments results in a range of different eigenvalues to be measured.

The first row of compartments 308a-308d, each is filled with normal water. The remaining compartments 308e-308p are each filled with a mixture of water and a contrast dopant that surrounds the arrays. As explained above, such dopants can include, but are not limited to, (CuSO4), Gd-DPDT, and heavy water. Each compartment in each row has the same specified amount of applied dopant, but preferably the amount of dopant varies among the rows. Thus, when the first matrix 304 of the phantom 300 is imaged using a DTI sequence, the eigenvalue along the axis of each array is the same for each compartment given distilled or doped water as the compartment fillant, while the two smallest eigenvalues spanning across the diameter of the capillaries should get smaller with smaller diameter. Those skilled in the art will understand how to construct other suitable ranges and arrangements.

The second matrix 306 is substantially similar to the first, with the notable difference being that there are no capillaries or arrays in any of the compartments 310a-310p. Rather, each compartment contains only water and optionally a dopant. In other words, the compartments 310a-310d include only water, while the compartments 310e-310p include a mixture of water and dopant. Typically, the number and shape of the compartments 310-310p of the second matrix 306 generally mirror that of the first matrix 304. Each column of compartments of the second matrix 306 can be identical to that of the other columns, as the amount of dopant varies between the rows. Preferably, the amount of dopant applied to each to each compartment 310 provides the same or substantially similar concentration as that of the corresponding compartment of the first matrix 304. Those skilled in the art will understand that a single column can be used, but preferably, a matrix of compartments having the same number as the first matrix is used to determine how noise varies across the image plane.

Nominally, DTI imaging of the water-filled compartments 310a-310p of the second matrix 306 should result in measurements of isotropic diffusion, whereas, the macro-array-filled compartments 308a-308p should show diffusion occurring more freely along the capillary array axis and more restricted across the diameter of the capillaries.

The increase in dopant allows for the SNR of each compartment to vary along this direction by shortening either a) the $T_1$-relaxation time to decrease magnetic saturation effects of water and increase signal intensity, or b) the $T_2$-relaxation time to decrease signal intensity in the DTI image series. Both types of dopants ($T_1$- and $T_2$-altering agents) result in an alteration of the image intensity and therefore vary the SNR bias. Dopant such as heavy water can also alter SNR of the image without altering $T_1$ and $T_2$ relaxation rates. Both the matrices of capillary array compartments and the free-water compartments contain this variation in contrast dopants.

The housing 302 further includes a plurality of water filled rods 320 attached to the exterior of the housing. Preferably, the rods 320 are spaced apart and attached to the housing 302 at equidistant points. In a typical example embodiment, four rods 302 are used to aid the user in properly aligning the phantom within the image field. However, those skilled in the art will understand any suitable number of rods can be used. As depicted, the length of each rod 320 can be approximately the same as the length of the housing 302, although in other embodiments, the lengths of the rods can be longer than or shorter than the length of the housing. Preferably, the rods 320 are constructed of a substantially rigid and durable material, such as but not limited to as plastics (polypropylene, polyethylene, etc.), PMMA, and glass. The rods 320 can be adhered to the housing 302 with a suitable glue or adhesive. Alternatively, the housing 302 can include a plurality of slots into which the rods are slid and secured (as per a mortise and tenon joint, for example). Those skilled in the art will understand that other suitable fasteners and fastening techniques can be employed to secure the rods 320 to the housing 302.

Preferably, the rods 320 are completely or substantially filled with water so that they can function as fiducials to provide imaging landmarks for proper alignment of the imaging plane with respect to the capillaries in the compartments 308a-308p. Given that the rods 320 are preferably in permanent alignment, the imaging plane can be prescribed in a variety of different directions, from which the angle with respect to the capillaries will be known. This feature allows for the testing of the measured eigenvector directions, given the actual orientation of the capillaries.

Optionally, the housing 302 can be wrapped with a thermal insulating material so as to keep the temperature (and the corresponding diffusivity within the compartments) constant. Additionally or alternatively, the housing 302 can be wrapped with thermal tubing 330, as shown in FIG. 8, so as to control the range of measurable eigenvalues by changing the temperature of the phantom. As shown in FIG. 8, a coil of plastic tubing 330 connected to a water bath circulation device (not shown) can provide a stable temperature during measurement as well as the adjustment of temperature. Raising or lowering the temperature should raise or lower all the measured diffusion eigenvalues together. Thus by changing the temperature, the range of eigenvalues can overlap more fully with realistic, measured values in tissue.

In an example manner of use, when the phantom 300 is imaged with a DTI sequence, the range of SNR values can be adjusted by scanning the phantom multiple times with the identical sequence, then averaging images in the DTI series together. SNR can be measured using the following formula:

$$SNR = \frac{\langle I_{compartment} \rangle}{0.66 \sigma_{air}}$$

Here, $I_{compartment}$ is the image intensity averaged within an ROI ("region of interest") in a compartment, and $\sigma_{air}$ is the standard deviation of image intensities calculated within an ROI outside of the phantom 300, where no signal should exist.

In summary, one would in practice preferably scan the phantom 300 a number of times using the same protocol, for averaging series together to increase SNR as well as for imaging after manipulating the phantom temperature to increase the range of measurable eigenvalues.

Accordingly, the configuration of the phantom 300 provides a reasonable amount of quality assurance by having at least two matrices of compartments. The first matrix 304 includes capillaries in the compartments 308a-308p, where the size varies from compartment to compartment and the contrast dopant varies from compartment to compartment. In this manner, a practitioner can look at a range of eigenvalues from compartment to compartment, which can be calculated using regions of interest in the images with different signal intensities (and corresponding signal-to-noise ratios) from compartment to compartment. Thus when the phantom 300 is imaged with a DTI sequence, all of the measurements of eigenvalues (three per image pixel in a region of interest) should be the same for a given capillary size. Any differences can be attributed to the introduction of systematic errors from the MR scanner system or noise, and that difference typically is of a different magnitude for each different capillary size.

In other words, by design, the phantom 300 allows for some degree of relative self-verification. Examining the capillary macro-array compartments 308a-308p, each column would yield the same trio of eigenvalues if there were no SNR bias. Furthermore, the second and third largest eigenvalues would be the same if there were no SNR bias because of the cylindrical symmetry of the capillaries. Considering the compartments 310a-310p (having no capillaries), all three eigenvalues for all compartments 310a-310p should be identical for no SNR bias, as diffusion in water is isotropic. Differences from those noted above result from the SNR bias that is to be determined.

In an alternative embodiment, the compartments 308, 310 are filled with one or more fluids in addition to or other than water that have different diffusivities. Such fluids can include, but are not limited to, mineral oil and alkanes. In this manner, those skilled in the art will understand that even though the eigenvalue would be the same within a plane, the eigenvalue along the axis of the arrays would vary from plane to plane.

Figure 9:
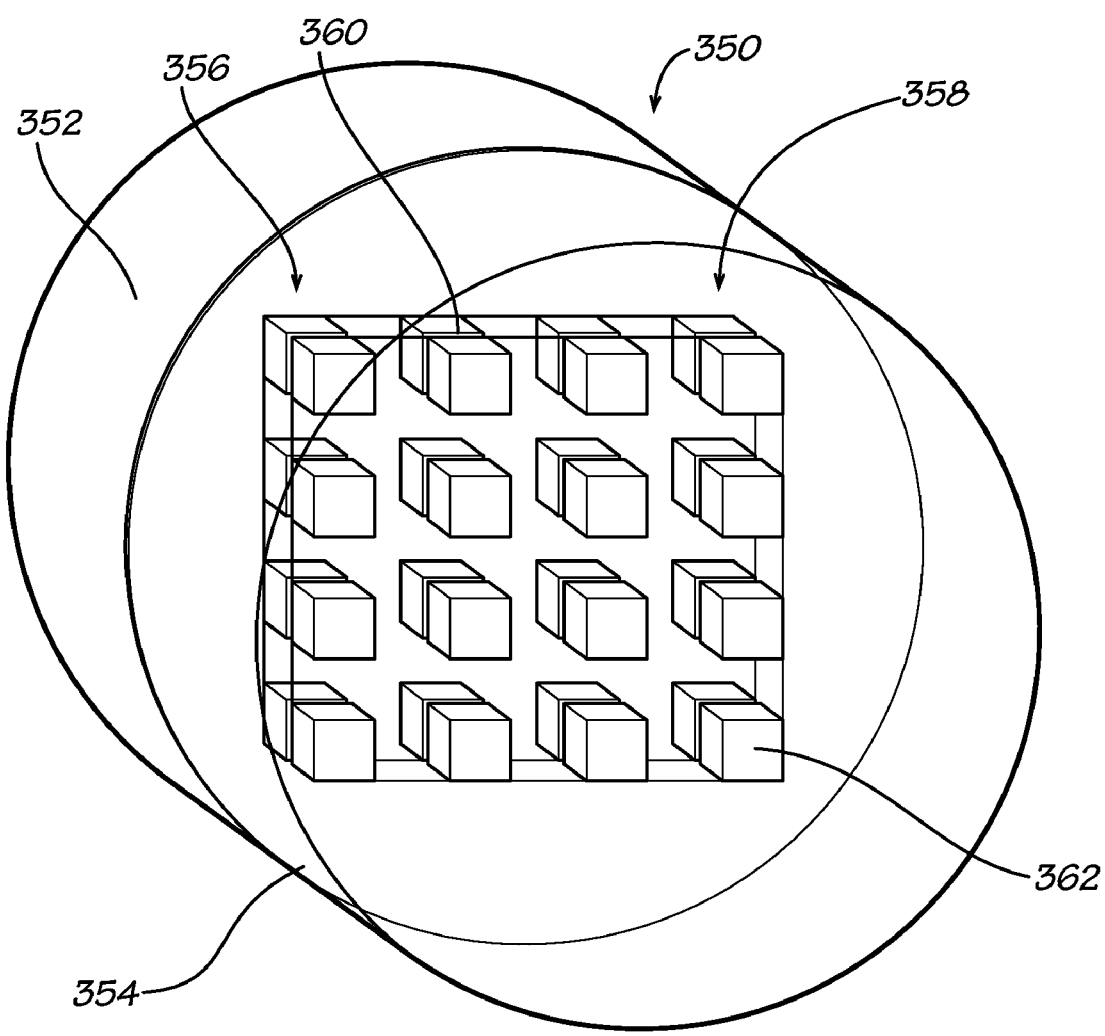
FIG. 9 depicts a perspective view of a phantom for use with DTI imaging according to a fifth example embodiment.

In still an alternative embodiment as shown in FIG. 9, a modular phantom 350 can be used. The phantom 350 includes a plurality of housings, wherein each housing comprises a matrix of compartments of capillary arrays or compartments of water and a mixture of water and dopant. Two such housings 352, 354 are depicted, although those skilled in the art will understand that additional housings can be employed. Also as shown, each housing 352, 354 can comprise a single matrix 356, 358 of compartments 360, 362. Preferably, each housing 352, 354 includes a fastener portion (not shown for purposes of clarity) for mating with a cooperating fastener of another housing. As such, two or more housings can be mated together. For example, the housings 352, 354 can be secured to one another with nylon screws, although other suitable fasteners and fastening techniques can be employed. If two generally cylindrical housings are used, then the housings can be mated at their respective faces.

With such a modular arrangement, the matrix 356 in housing 352 can include a plurality of arrays arranged in the manner disclosed in FIG. 1, while the matrix 358 in housing 354 can include a plurality of arrays arranged in the manner disclosed in FIG. 4. Also with such a modular arrangement, the phantom 350 can be modified or customized for a particular application where it may be advantageous to have a first matrix with certain features and one or more additional matrices with certain other additional features.

EXAMPLE APPLICATIONS OF THE INVENTION

Prior to describing the system and method of the present invention, a review of how a DTI sequence measures diffusion is now discussed. Use of a Stejskal-Tanner sequence to measure water diffusion in tissue along a particular direction, $\hat{r}_i$, allows for the diffusion to be calculated in an image voxel according to this familiar equation:

$$S_i = S_o e^{-b_i d_i} \qquad (1)$$

Here, $d_i$ is the apparent diffusion coefficient (ADC) measured along the direction $\hat{r}_i$. The measurement of ADC using a single diffusion-weighted (DW) image or a multi-direction DTI sequence requires the acquisition of an additional image with no diffusion weighting (a "b=0" image). In the above equation, $S_i$ is the DW-signal, and $S_o$ is the signal without any diffusion weighting. Both images share the same contrast weighting contribution from $T_2$ relaxation. The additional diffusion weighting for $S_i$ is controlled using magnetic gradients and is characterized by the parameter b, given by the following equation:

$$b_i = |g_i|^2 \gamma^2 \delta^2 \left( \Delta - \frac{\delta}{3} \right) \qquad (2)$$

The strength, duration, and separation of the diffusion gradient pulses applied along $\hat{r}_i$ are given as $|g_i|$, $\Delta$ and $\delta$, respectively. $\gamma$ is the gyromagnetic ratio of the proton.

Assuming that 3D tissue diffusion can be represented using a diffusion tensor, D, the measured ADC value is the projection of the tensor along the gradient direction: $d_i = \hat{r}_i^T D \hat{r}_i$. One can apply a rotation, R, to the gradient coordinate system such that the eigenvectors of the tensor align with the coordinate axes:

$$d_i = \hat{r}_i^T \mathcal{D} \hat{r}_i \quad (3)$$

$$= \hat{r}_i^T R^T \mathcal{D}_{\parallel} R \hat{r}_i \quad (4)$$

$$= \hat{p}_i^T \mathcal{D}_{\parallel} \hat{p}_i \quad (5)$$

In the coordinate system of the diagonalized tensor $D_{\parallel}$, the ADC value is sampled along some direction $\hat{p}_i = [\cos\theta_i; \cos\phi_i \sin\theta_i; \sin\phi_i \sin\theta_i]$, related to the gradient direction via the rotation R: $\hat{p}_i = R\hat{r}_i$.

$$d_i = \hat{p}_i^T \mathcal{D}_{\parallel} \hat{p}_i \quad (6)$$

$$= \sum_{j=1}^{3} \lambda_j p_{ij}^2 \quad (7)$$

$$= \lambda_1 \cos^2\theta_i + \lambda_2 \cos^2\phi_i \sin^2\theta_i + \lambda_3 \sin^2\phi_i \sin^2\theta_i \quad (8)$$

Figure 10:
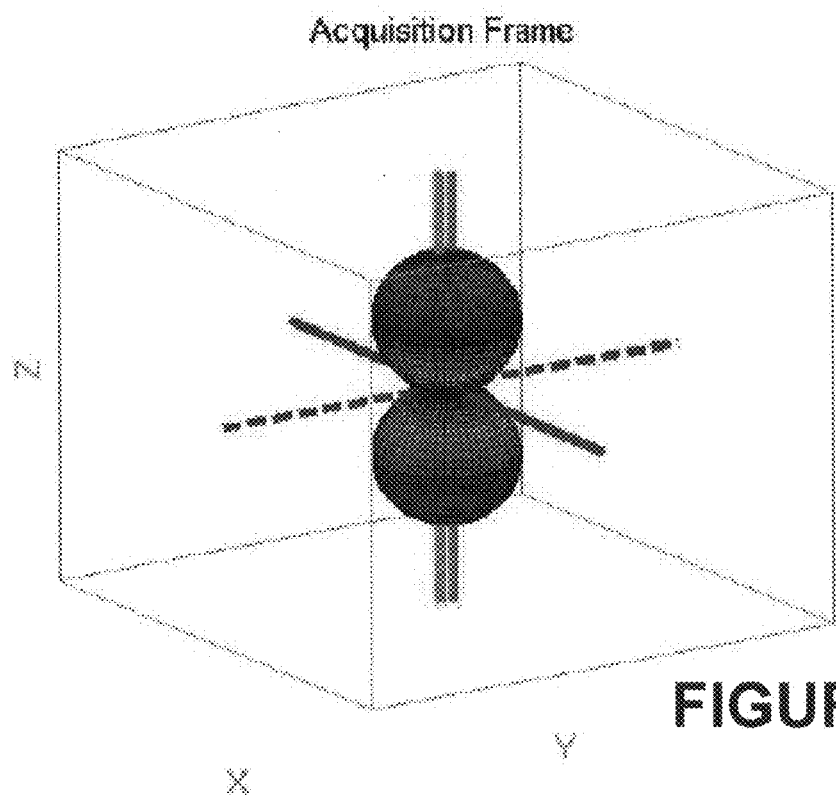
FIG. 10 depicts an acquisition frame from which a plurality of apparent diffusion coefficients ("ADCs") is acquired.

Here, $\lambda_i$ are the eigenvalues of the tensor, which lie along the x; y; z-axes in the frame of the diagonalized tensor. Because of the squared directional term in Equation 7, the sampled ADC distribution is proportional to the square of the angular distribution function describing actual diffusive behavior. For tensors with prolate symmetry (i.e., one large eigenvalue and two smaller, equal eigenvalues), associated with capillary structures, the distribution in Equation 5 forms the familiar "peanut" shape as depicted in FIG. 10 of the ADC distribution. Assuming cylindrical symmetry of the structure being imaged with the axis having the largest eigenvalue aligned along the z-axis, this distribution will specify an ADC value that can be measured by applying a gradient at the azimuthal and zenith angles ($\phi_i$; $\theta_i$) to the image plane.

The effect of systematic error or noise on the determination of $d_i$, leading to uncertainty or bias in eigenvalues, can be understood using Equations 1 and 2. Unstable or erroneous gradient performance can affect b, which can modulate $S_i$, $d_i$, and measurements of the tensor positively or negatively. On the other hand, noise in magnitude images follows a Rician distribution, adding a positive contribution to $S_i$ and to the non-DW b=0 signal ($S_o$) to a lesser extent. In general, this raises the value of $S_i$ when it becomes comparable to the mean value of noise, decreasing the measured value of $d_i$.

Synthesizing ADC Distributions Via Remapping of Gradient Directions During Reconstruction Although the phantom test object detailed in the first form can be used to perform QA measurements for DTI imaging, one can extend the utility of the phantom by using a technique to generate data showing diffusive characteristics more complex than those exhibited by the phantom under normal imaging conditions. A conventional DTI scan applies directional diffusion gradients during the "acquisition" phase of a DTI scan. Unlike a typical DTI scan, the ADC measurements of the present invention are treated in a "reconstruction" phase as if the gradients were applied in different directions. If diffusion gradients are applied along particular directions, but the tensors are calculated assuming that the gradients were applied along different directions, the ADC distribution is modified and the associated tensor shape is modified. Following this procedure, the ADC values derived from a real-world distribution can be rearranged into a distribution of choice. Given a set of reconstruction directions, a judicious choice of acquisition directions for each reconstruction direction allows for the synthesis of any distribution as long as the minimum and maximum ADCs in the distribution are bounded by Equation 8.

Case 1: Use of Prolate Geometry to Generate Oblate Data

To synthesize an oblate ADC distribution from a measured prolate distribution, one recognizes that the oblate distribution can be described as a solid of revolution generated by rotating a prolate distribution 360° around an axis. For example, rotation of the prolate distribution in FIG. 10 around a central axis parallel to $\hat{x}$ results in the oblate distribution shown in FIG. 11. Considering that the prolate distribution exhibits a higher diffusivity along $\hat{z}$, the solid of revolution specifies higher diffusivity in the y'-z' plane. Noting that the difference in diffusivity for both distributions lies along the $\hat{y}$, $\hat{y}_o$ axes, oblately-distributed ADC data that is to be reconstructed along $\hat{y}_o$ (shown by the green line in FIGS. 10 and 11) is acquired along $\hat{z}$ using the prolate structure. One simple acquisition scheme of the present invention to accomplish this involves turning on the z-gradient for any reconstruction direction with a z' or y' component:

$$\hat{r} = (x, y, z) = (\pm x', 0, \pm\sqrt{y'^2 + z'^2}) \quad (9)$$

After reconstruction, unrestricted diffusion measured along $\hat{z}$ can be redistributed within the y'-z' plane. In this scheme, the y component of the acquisition direction is set to zero, meaning that the y-gradient is not turned on.

Although this scheme is capable of synthesizing an oblate distribution, the duty cycle and direction of the gradients is not similar to scanner performance for a routine DTI protocol, where gradient directions are typically distributed fairly evenly over a sphere. Another scheme of the present invention that uses the gradients more like a clinical scan arises from the recognition that prolate diffusion is restricted equally along $\hat{x}$ and $\hat{y}$. When a reconstruction direction has a non-zero x' component, that component can be measured by sampling the prolate distribution in the x-y plane using a randomly-generated azimuthal angle $\alpha$:

$$\hat{r} = (x, y, z) = x' \cos\alpha, x' \sin\alpha, \pm\sqrt{y'^2 + z'^2} \quad (10)$$

Using this second scheme of the present invention, the fact that the z-component of the gradient directions is a function of uniformly distributed y' and z'' components indicates that the duty cycle of the z-gradient is somewhat higher than for an ordinary DTI sequence. Likewise, the duty cycle of the x- and y-gradient is somewhat less than for an ordinary DTI sequence.

Figure 11:
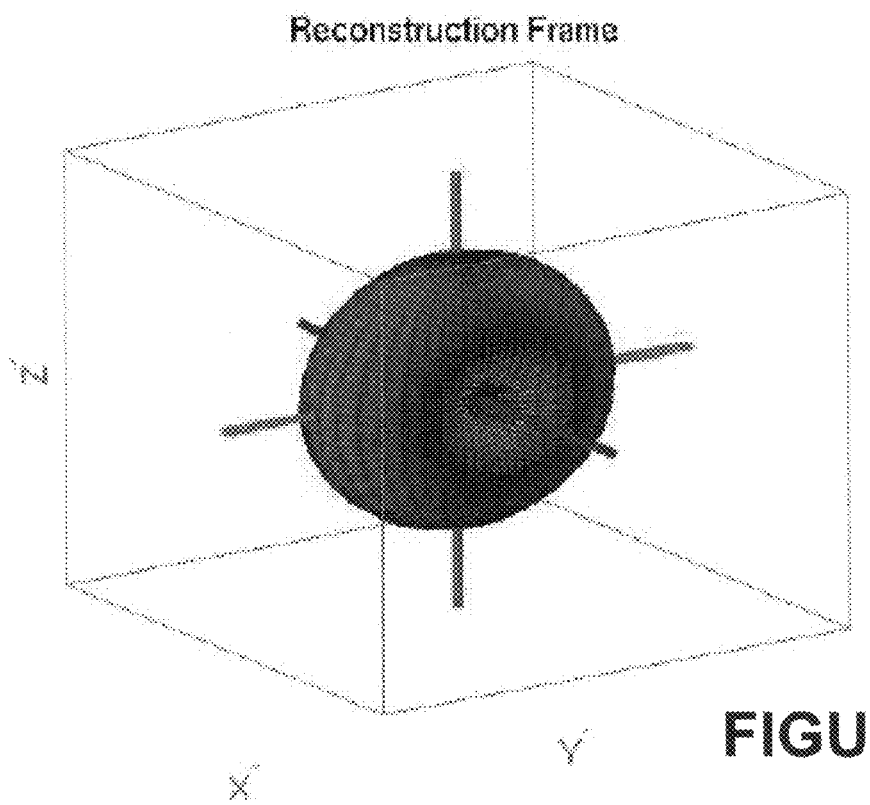
FIG. 11 depicts a reconstruction frame representing the synthesis of an oblate ADC distribution.

Two assumptions were made in this example to motivate the derivation of equations intuitively. These can be lessened to provide a more general result. The first assumption is that Equations 9 and 10 demand that the axes in the reconstruction frame are parallel to the axes in the acquisition frame. Under this assumption, the orientation of the synthesized oblate distribution with respect to the prolate distribution is shown in FIGS. 10 and 11. The second assumption is that the desired oblate distribution results from a solid of revolution using the measured prolate distribution. This leads to eigenvalues of the oblate distribution being equivalent to other eigenvalues in the prolate distribution (i.e., $(\lambda_1, \lambda_2)_{oblate} \equiv \lambda_{1,prolate}$ and $\lambda_{3,oblate} \equiv (\lambda_2, \lambda_3)_{prolate}$). This assumption is responsible for Equation 10 having no dependence on eigenvalues of either distribution.

Case 2: Use of Prolate Geometry to Generate Data for Two Intersecting Prolate Distributions In many fibrous tissues of a human or animal subject, a significant number of voxels contains fibers that cross or touch at oblique angles. An ADC distribution composed of two intersecting prolate distributions can also be reconstructed by acquiring data using specific gradient directions. Using the prolate ADC distribution and assuming that a voxel consists of two of these distributions with a mixing fraction $0<\eta<1$, one can calculate the composite ADC value expected for a particular reconstruction direction using the following equation:

$$\ln\left(\frac{S_i}{S_o}\right) \equiv -bd_{i,comp} = \ln\left[(1-\eta)e^{-b_1^1 d_i} + \eta e^{-b_1^2 d_i}\right] \quad (11)$$

The composite ADC is denoted as $d_{i,comp}$. Assuming for both prolate distributions that the principle axes with the largest eigenvalues ($\lambda_1$) are within the y-z plane, separated by an angle $\psi$, one can calculate the ADC component from each distribution $^1d_i$ and $^2d_i$ using Equation 8:

$$^1d_i = {}^1\lambda_1 \cos^2 \theta_i - {}^1\lambda_2 \cos^2 \phi_i \sin^2 \theta_i + {}^1\lambda_3 \sin^2 \phi_i \sin^2 \theta_i \quad (12)$$

$$^2d_i = {}^2\lambda_1(\cos\theta_i \cos\psi + \sin\phi_i \sin\theta_i \sin\psi)^2 - {}^2\lambda_2 \cos^2\phi_i \sin^2\theta_i + {}^2\lambda_3(\sin\phi_i \sin\theta_i \cos\psi - \cos\theta_i \sin\psi)^2 \quad (13)$$

For the sake of generality, each ADC component may have different eigenvalues $^1\lambda_j$ and $^2\lambda_j$. Computation of the composite ADC follows directly from Equations 11-13.

After calculating $d_{i,comp}$ for a given reconstruction direction, determination of the acquisition direction for transforming prolate data into the two-component distribution data is straightforward. From the cylindrical symmetry of the sampled prolate distribution, the 2D projection of the distribution is the same for any plane containing the axis of symmetry. For example, the cross-sectional profile of the prolate distribution in FIG. 10 is the same for the x-z plane, the y-z plane, or any plane containing the z-axis. Therefore, the problem of finding an ADC value in the prolate distribution that is equivalent to the $d_{i,comp}$ can be reduced to finding a solution in any of these planes. Choosing $\hat{r}_i$ to be within the x-z plane, the zenith angle, $\xi_i$, of the applied gradients would be the following:

$$\hat{r}=(x,y,z)=(\sin\xi, 0, \cos\xi) \quad (14)$$

The 2D function describing the cross-section of the prolate ADC distribution in this plane is given as $d_i = \lambda_1 \cos^2\xi_i + \lambda_3 \sin^2\xi_i$. Setting $d_i$ equal to $d_{comp}$ and solving the equation gives the zenith angle:

$$\xi_i = \cos^{-1}\left(\sqrt{\frac{d_{comp}-\lambda_3}{\lambda_1-\lambda_3}}\right) \quad (15)$$

As in the case of the simple scheme for synthesizing an oblate distribution, the duty cycle the gradients is not similar to scanner performance for a routine DTI protocol, from choosing to set the y-gradient to zero. Sampling the prolate distribution in the x-y plane at a random azimuthal angle α improves the uniformity of the distribution of gradient directions:

$$\hat{r}=(x,y,z)=(\sin\xi \cos\alpha, \sin\xi \sin\alpha, \cos\xi) \quad (16)$$

Figure 12:
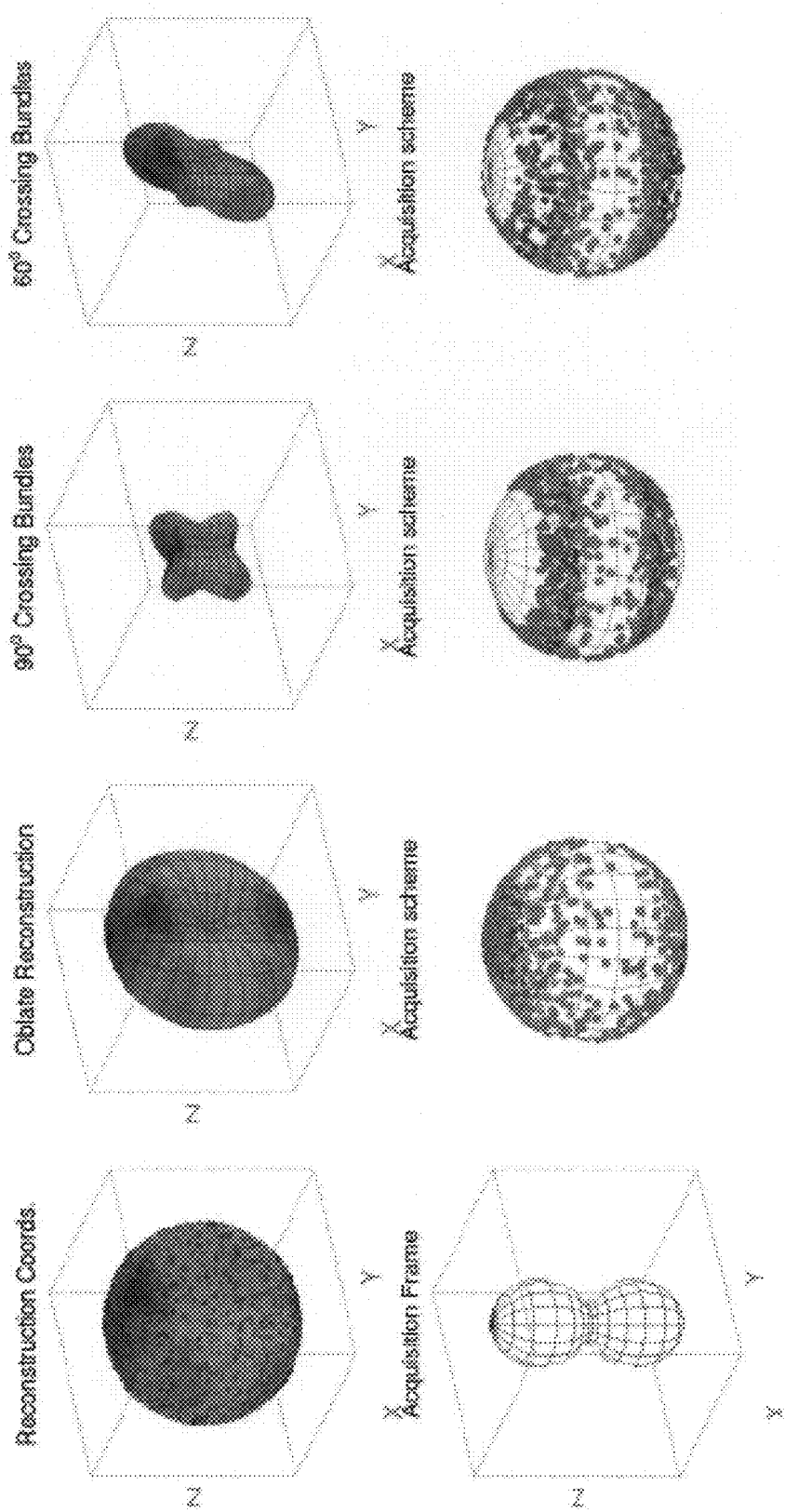
FIG. 12 depicts acquisition directions for synthesizing an oblate ADC distribution and the volume-averaged composite distribution for two identical prolate components (crossing angles $\psi=90°, 60°$).

FIG. 12 shows the relationship between acquisition and reconstruction directions for the schemes described by Equations 10 and 16. To show more detail in the distributions of FIG. 12, the b-value was assumed to be 5000 sec/mm². Coordinates for reconstruction are distributed uniformly over a sphere (shown as black dots in the upper left panel). Assuming this uniform distribution of reconstruction coordinates, the directions of the gradients applied for the reconstruction of particular distributions are indicated in the acquisition (lab) frame. As plotted in the acquisition frame, the colored points map where ADC data were sampled from a prolate distribution using the application of a gradient in a particular direction, to be remapped in reconstruction coordinates. The top row presents the reference frame for reconstruction, color-coded by direction, and the bottom row presents the reference frame of the sampled prolate distribution (i.e., acquisition).

Colored directions plotted on a sphere indicate where the data collected in the acquisition frame is remapped into the reconstruction frame. Data within regions of higher diffusivity for the oblate distribution (blue and green) result from sampling data at the poles of the prolate distribution. Furthermore, the two-component crossing distributions show smaller ADC values in general, constraining the sampling of the prolate distribution away from the poles where ADC is largest.

The synthesis of two-tensor component distributions can be generalized to one-component distributions as well. Most generally, any distribution in any orientation can be synthesized from the measured ADC distribution as long as the minimum and maximum values of the measurements bound the minima and maxima of the synthesized distribution. Equation 15 can be used to find $\xi_i$ for any sample of an appropriate distribution if $d_{comp}$ is replaced with di, and Equation 16 will still be true.

If directions for reconstruction are sampled homogeneously over a sphere, the duty cycle for each gradient may be somewhat different than for a clinical scan (as shown in FIG. 12). So, these synthesized distributions may not capture precisely those systematic errors originating in gradient performance. Another consideration for this method is that the gradient direction prescription (i.e., acquisition frame) relies on accurate knowledge concerning the orientation of the prolate distribution. Inaccurate prescription of the gradient directions can lead to errors in the reconstructed distribution. One final consideration is that specified gradient directions for synthesis rely on accurate knowledge of the measured prolate ADC distribution, including eigenvalues. Differences in the measured values and those used to calculate the gradients may arise because of uncertainty in phantom material being imaged, or because of environmental variables such as temperature. These differences can introduce error into the shape of the final two-component distributions.

Example 1

Scanner behavior was simulated using MATLAB (Mathworks, Natwick, Mass.). The gradient directions specified by the standard GE MR system file (tensor.dat), which are distributed evenly over a sphere, were assumed for data reconstruction for all synthesized distributions. Simulations were used to generate the proper directions along which to apply gradients during acquisition. The principle axis of the measured prolate structure in the phantom was assumed to point along the A-P axis in the scanner.

Both phantoms 100 and 150 of FIGS. 1 and 4 were used in this example. The phantom 100 was scanned using a GE Excite HDx 3.0T MRI scanner (GE Medical Systems, Milwaukee, Wis.), using an eight-channel head coil to image the prolate ADC distributions in an ROI containing the capillaries. Capillaries were bound into hexagonal arrays measuring ~0.5 mm in cross section. Data from scans of the phantom 100 were used to synthesize other distributions.

The phantom 150 was scanned using a GE Excite HDx 3.0T MRI scanner (GE Medical Systems, Milwaukee, Wis.), using an eight-channel head coil. The data from this configuration was used to confirm the general shape of the two-component distribution. While all water in designated ROIs for the phantom 100 was contained within the arrays, the stacking pattern for the phantom 150 led to a portion of water outside of the macro-array shown by arrows 160 in FIG. 3 (~40% by water volume). Because of the increase in water external to the arrays, higher ADC values in all directions and lower anisotropy were expected as compared with the synthesized 900-crossing distribution.

Eighteen series of data were acquired. The directions specified for reconstruction were equal for all series. Series #1-17 were scanned with the phantom 100, using different acquisition directions to synthesize oblate diffusive geometry, two prolate components crossing at 90°, and two components crossing 60°. Series #18 was scanned with the phantom 150.

Series #1-15 and #18 used identical protocols except for the directions in which the gradients were applied. A 9-slice axially-oblique DTI sequence was executed (5 b=0 images; 36 directions; b=1000 sec mm$^{-2}$; TR=4 sec; TE=83 msec; FOV=160 mm; slice thickness=4 mm; 1.5 mm gap; Acq. Matrix=128×128; Recon. Matrix=256×256). The slice direction was chosen such that the arrays were approximately coplanar with an image plane, centered between slice boundaries of one image slice. Placement of the imaging plane was determined using a high-resolution image series for image localization.

To demonstrate that SNR biasing of synthetic distributions is the same as for measured distributions, the protocol for series #16-17 was altered to yield a lower SNR value. Data from series #16 were reconstructed into the measured prolate distribution as well as being synthesized into an oblate distribution; series #17 was used to examine two prolate components crossing at 60°. All parameters of this protocol were the same as above, except for the following items: 3 slices; TR=3 sec; slice thickness=2 mm; 3.5 mm gap; Acq. Matrix=256×256. SNR was calculated using the b=0 images only. Subtraction of two b=0 images yielded a noise image. Within an ROI containing the capillary arrays, the standard deviation of the noise image and the mean signal of one b=0 image were measured. Although the noise distribution of MR magnitude images is Rician rather than Gaussian, image SNR was empirically defined as the ratio of signal to the standard deviation. The mean SNR was 7.4 for series #16-17 and 38.5 for all other series.

As shown in Equation 10, the specified gradient directions for synthesizing the oblate distribution do not depend on the eigenvalues of the original distribution. However, there is an eigenvalue dependence in the equations to synthesize a two-component distribution, whereas the actual measured eigenvalues may be affected by temperature variations. To study this dependence, acquisition directions were determined after assuming eigenvalues that were significantly larger or smaller than expected. Except where noted, eigenvalues of $(\lambda_1; \lambda_2; \lambda_3)$=(2:4; 0:7; 0:7) mm$^2$ sec$^{-1}$ were used, based on previous experience with the capillary arrays of similar size. Series #10-11 assumed $(\lambda_1; \lambda_2; \lambda_3)$=(2:5; 0:4; 0:4) mm$^2$ sec$^{-1}$ and series #12-13 assumed $(\lambda_1; \lambda_2; \lambda_3)$=(2:5; 1:4; 1:4) mm$^2$ sec$^{-1}$, to examine the importance of the eigenvalue assumption on the crossing-component diffusion distributions.

The accuracy of the alignment of the prolate distribution is also important for accurate gradient specification. Approximate rotations of 5+ and 10° were applied to the scan plane of the prolate distribution in series #4-9, to deliberately misalign the capillary arrays with the acquisition frame of reference. Differences in these synthesized distributions were quantified.

Data Analysis of Example 1

ROIs were chosen that contained the array assembly only (approximately 350 voxels). ADC data measured within all voxels in the ROIs were averaged into one measurement per gradient direction, as if the data were acquired in one voxel. Data from each image series was reassembled into two different ADC distributions. First, the use of gradient acquisition directions during reconstruction allowed data to be fit to distributions that were "measured" in the scanner frame of reference, resulting in eigenvalues characteristic of prolate distributions. Differences between the measured and expected ADC values for a fit prolate distribution were considered to be characteristic of the best possible measurement outcome. Second, the use of the spherically-symmetric reconstruction directions allowed for the data to be rearranged into "synthesized" distributions.

The effect of low SNR on ADC distributions was simulated, for comparison to data in series #15-16. Each ADC measurement in a specified distribution was Fourier transformed before adding multiple gaussian-distributed complex noise values, resulting in 512 noisy ADC samples after inverse transformation. The noise distribution was normalized such that its standard deviation in magnitude images matched observations of series #15-16. Mean ADC distributions after the addition of noise were plotted.

The quality of how well the data matched a distribution was evaluated for distributions that were expected according to theory, and for fitted distributions using either one tensor component (oblate) or two tensors (crossing distributions). Synthesized data distributions were also compared to a sphere for reference, which should provide a poor fit for comparison. The theoretical ADC distributions were derived using eigenvalues from the fit to a prolate distribution. To determine fits of one-tensor distributions, data within ROIs were fit to a global tensor to perform a linear least-squares fit. Eigenvalues, fractional anisotropy, and eigenvectors were calculated. Because a generalized fit to a two-tensor distribution may be ill-constrained and non-convergent, the two-tensor distributions were determined using the following assumptions. Both tensor components were assumed to be the same, and the smallest two eigenvalues were set equal to each other. Furthermore, they were set to the smallest eigenvalue of the one-tensor fit, $\lambda_3$. Finally, the eigenvectors for the largest eigenvalues were considered to be orthogonal to the eigenvector for the smallest eigenvalue from the one-tensor fit. These assumptions leave two free parameters: the largest eigenvalue, $\lambda_1$, and the angle separating the two tensors, $\theta$. These parameters were varied over a limited range ($0° < \theta < 90°$; $\lambda_{3,1\text{-}tensor} < \lambda_{1,2\text{-}tensor} < 3\lambda_{1,1\text{-}tensor}$) to minimize the difference between measured and theoretical ADC values using least squares. The search for values of $\lambda_1$ and $\theta$ was performed iteratively.

The quality of how well the data matched a distribution was evaluated for distributions that were expected according to theory, and for fitted distributions using either one tensor component (oblate) or two tensors (crossing distributions). Synthesized data distributions were also compared to a sphere for reference, which should provide a poor fit for comparison. The theoretical ADC distributions were derived using eigenvalues from the fit to a prolate distribution. To determine fits of one-tensor distributions, data within ROIs were fit to a global tensor to perform a linear least-squares fit. Eigenvalues, fractional anisotropy, and eigenvectors were calculated. Because a generalized fit to a two-tensor distribution may be ill-constrained and non-convergent, the two-tensor distributions were determined using the following assumptions. Both tensor components were assumed to be the same, and the smallest two eigenvalues were set equal to each other. Furthermore, they were set to the smallest eigenvalue of the one-tensor fit, $\lambda_3$. Finally, the eigenvectors for the largest eigenvalues were considered to be orthogonal to the eigenvector for the smallest eigenvalue from the one-tensor fit. These assumptions leave two free parameters: the largest eigenvalue, $\lambda_1$, and the angle separating the two tensors, $\Theta$. These parameters were varied over a limited range ($0°<\Theta<90°$; $\lambda_{3,1\text{-}tensor}<\lambda_{1,2\text{-}tensor}<3\lambda_{1,1\text{-}tensor}$) to minimize the difference between measured and theoretical ADC values using least squares. The search for values of $\lambda_1$ and $\Theta$ was performed iteratively.

Differences between the measured and expected distributions were characterized using two metrics. First, reported RMS values were calculated, corresponding to the root-mean-square differences between ADC measurements and expected ADC values ($\Delta ADC_{RMS}$). The ratio of these measures to the eigenvalues gives an estimate of the mean percentage error of any ADC value in a measured or synthesized distribution.

Second, differences between the measured and expected ADC values for a given distribution may have a spatial dependence that is not represented by the value of $\Delta ADC_{RMS}$. For example, in the case when the measured ADC variations along the eigenvector of principle diffusion are larger than those along directions having smaller ADC, the measured distribution may look similar to the expected distribution, but $\Delta ADC_{RMS}$ may be large compared to the smallest eigenvalues. To capture this information more readily, the approximate percentage of mutual overlap between the volume enclosed by measured ADC values and the expected distribution volume were calculated. The Dice similarity criterium (DSC) was used to quantify the overlap for the two volumes $V_1$ and $V_2$, given by the following expression:

$$DSC = \frac{2(V_1 \cap V_2)}{V_1 + V_2} \quad (17)$$

To estimate the volume using the sparse sampling of ADC measurements, volume was considered to be proportional to the sum of all cubed measurements, $ADC_i^3$. Because both the numerator and denominator of Equation 17 contain volume terms, it was assumed that the differences in volume are characterized predominantly by this proportionality. From this, a modified version of DSC can be defined as:

$$DSC = \sum_{i=1,N} \frac{DSC_i}{N}$$

$$DSC \equiv \sum_{i=1,N} \frac{2}{N}\left(\frac{ADC_{i,meas}^3 \cap ADC_{i,dist}^3}{ADC_{i,meas}^3 + ADC_{i,dist}^3}\right)$$

Here, $ADC_{i,meas}^3$ and $ADC_{i,dist}^3$ are the cubed ADC values that were measured or expected for a given distribution, respectively. The DSC parameter varies from 0 (0% overlap) to 1 (100%, full overlap). The logit transform was performed to make statistical inferences:

$$logit(DSC) = \ln\frac{DSC}{1-DSC}.$$

This creates a statistic with a range of ($-\infty$, $\infty$). Histograms showing the distribution of individual values of logit($DSC_i$) for each set of ADC measurements are approximately normal, although this result is qualitative. Differences of the logit (DSC) values between all of the distribution were quantified statistically for each synthesized geometry, with significant differences between pairs of distributions identified using the Tukey HSD test. For reference, values of logit(DSC)=0.5, 1.0, 2.0, 3.0, 4.0 cover the range in this example, and they correspond to the values of DSC=0.63, 0.73, 0.88, 0.95, 0.98. For all other individual comparisons of logit(DSC) noted in this example, a two-tailed student t-test was used.

Results of Example

Figure 13:
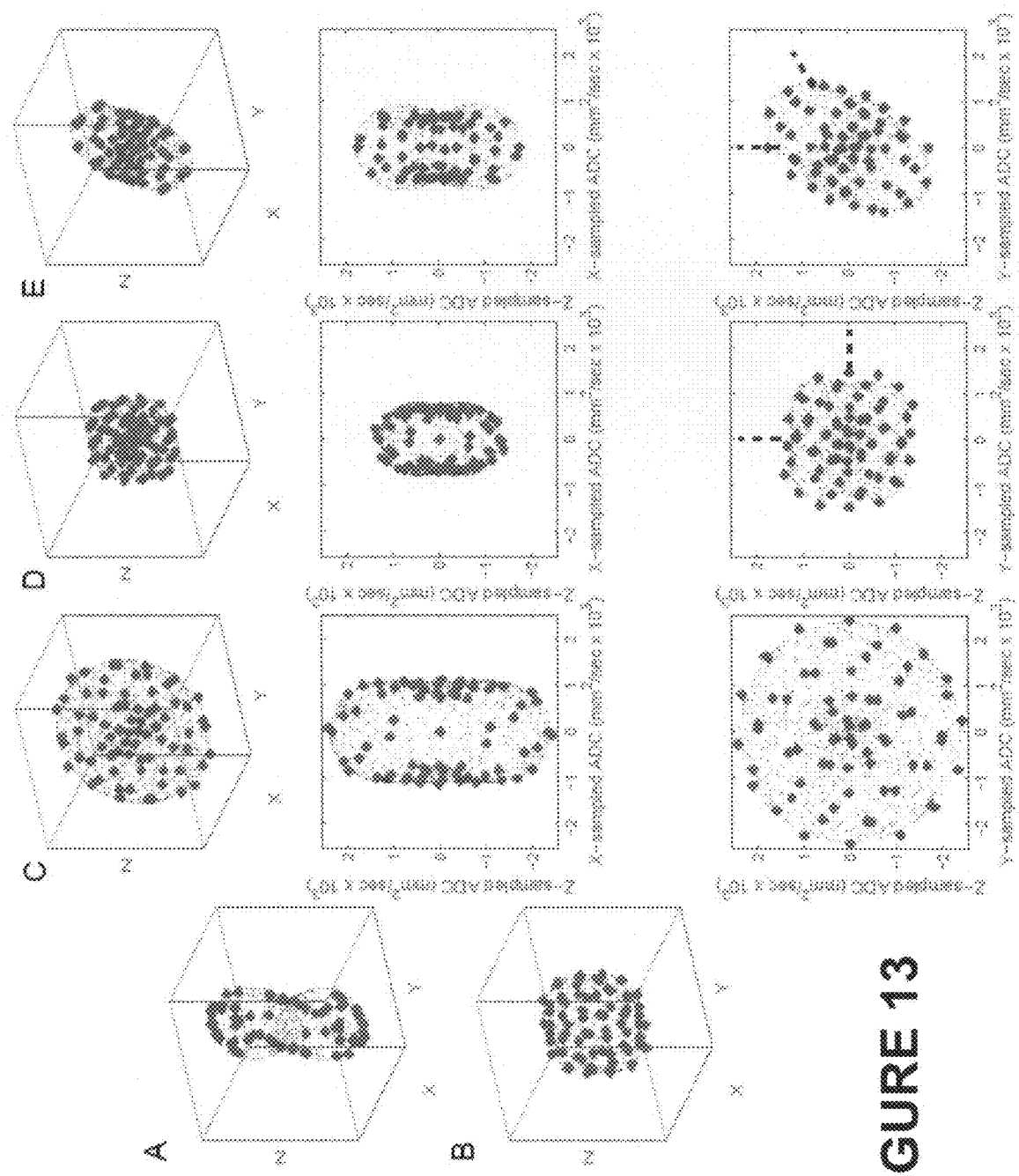
FIG. 13 depicts comparisons of theoretical ADC distributions and measured or synthesized ADC distributions.

Data acquired in these examples and averaged across the ROI are presented as red dots in FIG. 13, representing the sampled diffusion distribution. Theoretical distributions derived using a tensor fit to the prolate data are shown as a cloud of black points. In general, the ADC measurements resemble the theoretical distributions. The distribution of data gathered with the phantom 150 qualitatively resembles the 90°-crossing distribution data, with the largest values of ADC pointing in between the eigenvectors for each of the largest eigenvalues of the two tensors.

Data from series #1-3 were acquired using gradient directions specified above with respect to cases 1 and 2 to synthesize oblate and two-component diffusive behavior after reconstruction with a different set of directions. Use of the same acquisition directions during reconstruction lead to ADC distributions with prolate characteristics that should be identical for all of these series. The data that were reconstructed in this manner from series #1 is shown in Panel A of FIG. 13. The mean tensor eigenvalues for all three series were found to be $(\overline{\lambda_1}, \overline{\lambda_2}, \overline{\lambda_3})$=(2.42±0.02, 0.70±0.03, 0.66±0.05)× $10^{-3}$ mm²/sec. The uncertainty reported here is the standard deviation in each measured eigenvalue and does not consider additional noise-based bias. The eigenvalues match well with the value assumed during the derivation of the gradient directions: $(\overline{\lambda_1}, \overline{\lambda_2}, \overline{\lambda_3})$=(2.4, 0.7, 0.7)×$10^{-3}$ mm²/sec. The unrestricted eigenvalue ($\lambda_1$) points primarily along the y-axis as expected, with a mean deviation off of the y-axis $\theta_1$=1.7°.

Table I shows a compilation of results, comparing ADC values from series #1-3 to different spatial distributions. The designations of "Measured" or "Synthesized" refer to whether reconstruction directions are the same or different from acquisition directions, resulting in prolate or synthesized distributions. Parameters from the one- and two-tensor fits generally correspond to expected values, although some differences exist. For the oblate data, variation in the eigenvalues from expectation and difference from one another is consistent within uncertainty and the expected amount of noise-dependent bias for this experiment. The principle eigenvalue $\lambda_1$ from the two-tensor fits for the crossing data show significant differences from the prolate value using a t-test (p<0.01 in both cases), although the difference is only ≈10%. The tensor crossing angle, $\Theta$, for both is similar to expectation, although the variation from expectation for the 60°-crossing distribution is ~6 times larger than the 1.7° variation noted above.

TABLE I

DTI metrics for measured and synthesized data.

| Quantity | Config A | | |
|---|---|---|---|
| | Oblate | 90°-crossing | 60°-crossing |
| | | Measured | |
| Prolate $\lambda_1, \lambda_2, \lambda_3$ ($\times 10^{-3}$ mm$^2$ sec$^{-1}$) | (2.43, 0.67, 0.60) | (2.42, 0.72, 0.68) | (2.40, 0.72, 0.70) |
| Prolate $\theta_1$ | 1.46° | 1.93° | 1.73° |
| Prolate $\Delta ADC_{RMS}$ ($\times 10^{-3}$ mm$^2$ sec$^{-1}$) | 0.07 | 0.06 | 0.05 |
| Prolate logit(DSC)† | 3.00 ± 0.15 | 3.14 ± 0.17 | 3.25 ± 0.19 |
| Spherical distribution: | | Synthesized | |
| $\bar{r}$ ($\times 10^{-3}$ mm$^2$ sec$^{-1}$) | 1.84 | 1.13 | 1.14 |
| $\Delta ADC_{RMS}$ | 0.53 | 0.28 | 0.34 |
| logit(DSC)† | 0.92 ± 0.25 | 1.02 ± 0.19 | 0.80 ± 0.16 |
| One-tensor fit: | | Synthesized | |
| $\lambda_1, \lambda_2, \lambda_3$ | (2.47, 2.38, 0.66) | — | — |
| $\Delta ADC_{RMS}$ | 0.06 | — | — |
| logit(DSC)† | 3.33 ± 0.17 | — | — |
| Two-tensor fit: | | Synthesized | |
| $\lambda_1$ | — | 2.64 ± 0.03 | 2.67 ± 0.03 |
| $\Theta$ | — | (87.3 ± 0.9)° | (69.5 ± 0.7)° |
| $\Delta ADC_{RMS}$ | — | 0.15 | 0.12 |
| logit(DSC)† | — | 2.15 ± 0.19 | 2.65 ± 0.27 |
| Theoretical distribution: | | Synthesized | |
| $\Delta ADC_{RMS}$ | 0.07 | 0.13 | 0.13 |
| logit(DSC)† | 3.22 ± 0.17 | 1.94 ± 0.15 | 2.06 ± 0.16 |

†The SEM for 36 measurements are reported as uncertainies.

Considering that the measured ADC distribution for series #1-3 should correspond to a prolate tensor, the values of $\Delta ADC_{RMS}$ and DSC for this comparison should be representative of the best fit possible. Similarly, a spherical distribution should generally yield a poor fit of the data, given the synthesized distributions shown in Columns C-E of FIG. 13. The variation in ADC measurements with the mean fit indicated by $\Delta ADC_{RMS}$ was small for the prolate distribution ($\approx 0.06 \times 10^{-3}$ mm$^2$ sec$^{-1}$, approximately 5% of the mean ADC value of $1.3 \times 10^{-3}$ mm$^2$ sec$^{-1}$ in these distributions). For the spherical distribution, a comparison of $\Delta ADC_{RMS}$ with the mean fit radius, $\bar{r}(=\overline{ADC})$, indicates variation from the distribution between 25-30% of the mean ADC fit. The mean value of DSC (logit(DSC)=3.13) for the prolate distribution indicates that approximately 96% of the volume of the measured distribution overlaps with the fit prolate distribution. The poorly-fitting spherical distribution yields a value of $DSC_{overlap}$ of 69-74% overlap (logit(DSC)=0.80-1.02) between the measured and fit distribution volumes. Using the Tukey test, this difference in data overlap between spherical and prolate distributions is significant (p<0.01) for all three series.

Given the range of $\Delta ADC_{RMS}$=5-30% variation to characterize the mean variation of ADC measurements and logit (DSC)=0.8-3.13 to characterize how well the volumes overlap, values for these quantities comparing the fit and theoretical distributions to synthesized ADC distributions should lie somewhere in between. In all cases, the fit distributions show better overlap than the theoretical distributions, although the differences are not significant using the Tukey test. Additionally, differences between the prolate and theoretical distribution overlap with data are not significant. For the cases of the 60°-crossing and oblate synthesized distributions, the overlap from fit distributions are significantly different from the overlap with a spherical distributions. The lack of significant difference between overlap for a spherical distribution and either a theoretical or fit distribution for the 90°-crossing data is probably due to the fact that spatial variation for this crossing data should be smaller than for other distributions, as shown in FIG. 13. At any rate, the spherical distribution shows the lowest amount of overlap.

As expected, RMS values for the synthesized distributions generally lie between the range found for comparisons to the prolate and spherical distributions. For the synthesized oblate distribution, very little difference exists between any of the comparisons except for spherical. For the crossing distributions, the spherical rms values are the largest, although the values for the fit and theoretical distributions are not as small as for the prolate distribution. Furthermore, very little RMS improvement over the theoretical distribution is gained by fitting a distribution.

Figure 14:
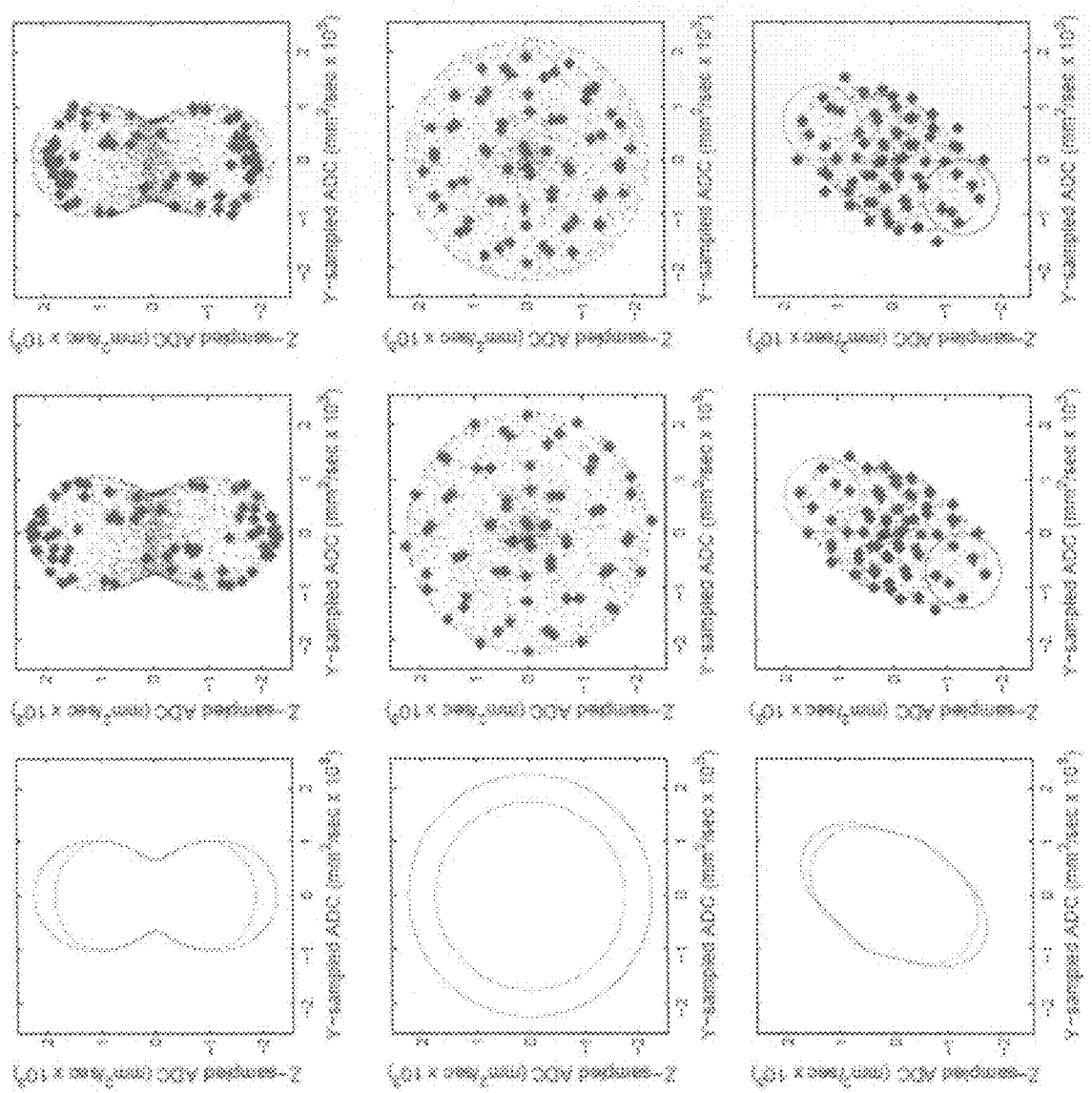
FIG. 14 depicts the effect of SNR (signal-to-noise ratio) decrease on prolate (top row) and synthesized (other rows) ADC distributions.

Given that the synthesized data match theoretical distributions, these distributions exhibit the same noise properties as actual measurements. Biasing of ADC measurements as SNR decreases is demonstrated in FIG. 14, both for the measured prolate distribution (top row) and for synthesized distributions (bottom rows). The synthesized distributions compare favorably with expected decreases in large ADC values in a qualitative sense.

Figure 15:
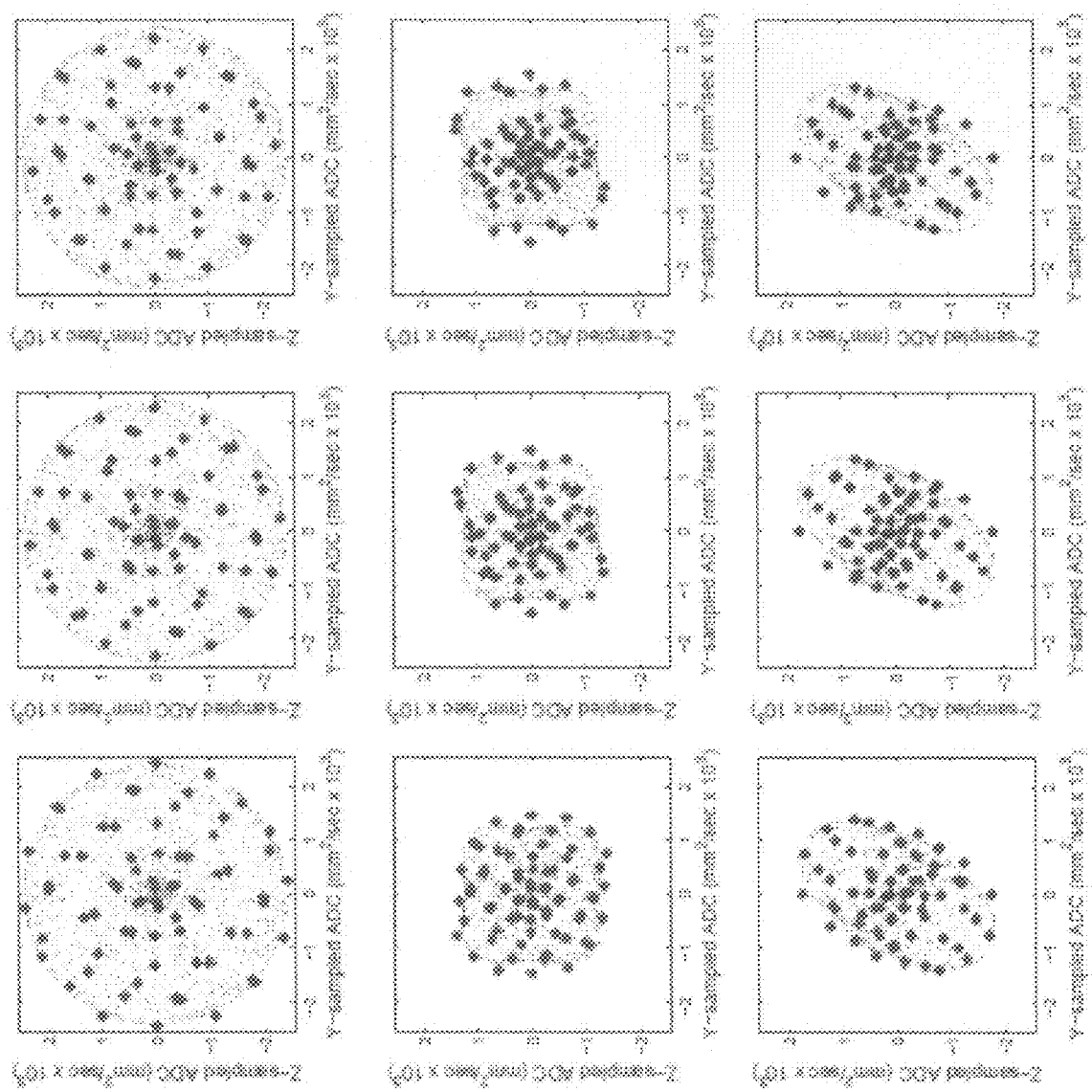
FIG. 15 depicts the effect of rotating of the scan plane from the orientation used to calculate appropriate diffusion gradients.

Table II demonstrates how alignment errors of the phantom or initial eigenvalue assumptions may affect the measured distribution. This table compares measurements with the theoretically expected distribution. Mean misalignments of the scan plane by approximately 0°, 5°, and 10° were determined using a fit to the prolate distribution to be 1.7°, 7.7°, and 11.3°, consistent within the expected variation of 1.7°. Measured RMS values and DSC are dramatically affected by angular misalignment, as shown in FIG. 15. One can use the data in Table II to extrapolate the best possible values of $\Delta ADC_{RMS}$ and DSC for no misalignment: $\Delta ADC_{RMS}$=0.03, 0.08, 0.09×10$^{-3}$ mm$^2$/sec and DSC=97%, 90%, 91% for the oblate, 900, and 60°-crossing distributions. These RMS values are close to the best-fit values expected with a prolate fit. Table II shows that misalignment by $\approx 8°$ lowers these overlaps to DSC=92%, 74%, 76%, which demonstrates a significant degradation in overlap (p<0.01) for all three crossing distributions using a test. Large differences in assumed values of the smallest eigenvalues change the rms values or overlap parameters with only marginal significance (p≧0.05).

TABLE II

DTI metrics for synthesized distributions, after phantom misalignment or faulty eigenvalue assumption.

| Geometry | Prolate $\theta_1$‡ (measured) | Assumed $\lambda_2 \equiv \lambda_3$ ($\times 10^{-3}$ mm² sec⁻¹) | $\Delta ADC_{RMS}$ | logit(DSC)$_{overlap}$† |
|---|---|---|---|---|
| Oblate | 1.5° | 0.7 | 0.07 | 3.22 ± 0.17 |
|  | 7.4° | 0.7 | 0.16 | 2.57 ± 0.22 |
|  | 11.1° | 0.7 | 0.26 | 1.93 ± 0.20 |
| 90°-crossing | 1.9° | 0.7 | 0.13 | 1.94 ± 0.17 |
|  | 8.0° | 0.7 | 0.26 | 1.05 ± 0.23 |
|  | 11.3° | 0.7 | 0.35 | 0.55 ± 0.25 |
|  | 3.3° | 1.4 | 0.12 | 1.99 ± 0.13 |
|  | 3.2° | 0.4 | 0.11 | 2.55 ± 0.24 |
| 60°-crossing | 1.7° | 0.7 | 0.13 | 2.06 ± 0.16 |
|  | 7.6° | 0.7 | 0.24 | 1.15 ± 0.22 |
|  | 11.5° | 0.7 | 0.33 | 0.69 ± 0.28 |
|  | 2.5° | 1.4 | 0.13 | 2.07 ± 0.14 |
|  | 2.7° | 0.4 | 0.13 | 2.21 ± 0.24 |

†The SEM for 36 measurements are reported as uncertainies.
‡The scan plane was aligned to $\theta_1 = 0°$, excluding systematic precision.

Accordingly, the present invention characterizes the effect of systematics or noise in a DTI sequence on images of tissue structures, using data acquired from a scanner using a simple phantom with capillary structures. In the context of clinical operation, acquiring diffusion-weighted (DWI) images using a spherical phantom and calculating a single ADC value in a QA procedure may not adequately capture the behavior of a DTI sequence. The added value of this technique is to examine the effect of noise on measurements made in tissues having diffusion characteristics that are anisotropic and geometrically complex, using the phantom as a tissue proxy. The complexity of human tissue is difficult to reproduce in a phantom, to represent anisotropy; however, one advantage of basing QA on a simple structure is that its diffusion characteristics can be characterized precisely. Knowing that a range of precise ADC values can be measured using this structure in the absence of bias, these ADC values can be synthesized into more complicated spatial distributions without using complicated structures. The addition of bias or measurement uncertainty to the ADC measurements should affect directly the complicated distributions. Because synthesized distributions are assembled by sampling appropriate ADC values from a prolate distribution, $\Delta ADC_{RMS}$ and DSC values should be identical between the prolate and synthesized distributions.

Certainly, FIG. 13 demonstrates that this technique can reproduce complex ADC distributions qualitatively. In particular, the method of the present invention for synthesizing oblate distributions presented in Case 1 yields an ADC distribution with virtually identical error to those acquired in the original prolate distribution. On the other hand, the distributions with crossing tensor components showed a trend of more variability than expected, although the significance of this effect was only marginal at best. Changes in the distribution shape as a function of SNR qualitatively resemble those expected from simulation.

QA Procedure of the Present Invention

A specialized scan sequence can perform all steps of the data acquisition and analysis and provide a quality assurance procedure for DTI analysis. A quality assurance procedure of the present invention includes first scanning a phantom of the present invention to determine the characteristic prolate distribution. The next step is to calculate the appropriate gradient directions within pulse sequence code for the desired synthetic distribution. Lastly, new data can be acquired with the new gradient directions, for synthesis into complicated ADC distributions and for characterizing the effect of noise on these complicated distributions, thereby characterizing the effect of noise on data from tissue with similar diffusive properties.

The methods of the present invention can be embodied in computer program elements. Computer program elements of the invention may be embodied in hardware and/or in software (including firmware, resident software, micro-code, etc.). The invention may take the form of a computer program product, which can be embodied by a computer-usable or computer-readable storage medium having computer-usable or computer-readable program instructions, "code" or a "computer program" embodied in the medium for use by or in connection with the instruction execution system. In the context of this document, a computer-usable or computer-readable medium may be any medium that can contain, store, communicate, propagate, or transport the program for use by or in connection with the instruction execution system, apparatus, or device. The computer-usable or computer-readable medium may be, for example but not limited to, an electronic, magnetic, optical, electromagnetic, infrared, or semiconductor system, apparatus, device, or propagation medium such as the Internet. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner. The computer program product and any software and hardware described herein form the various means for carrying out the functions of the invention in the example embodiments.

While the invention has been described with reference to preferred and example embodiments, it will be understood by those skilled in the art that a variety of modifications, additions and deletions are within the scope of the invention, as defined by the following claims.

The invention claimed is:

1. A medical test device for use with a magnetic resonance imaging (MRI) scanner using a diffusion tensor imaging (DTI) sequence to generate a baseline model of human or animal tissue, comprising:
   a plurality of anisotropic arrays stacked in a plurality of rows to form a macro-array, wherein each of the arrays includes a plurality of capillaries and each of the capillaries holds a first fluid; and
   a housing, holding a second liquid, wherein the arrays are housed within the housing,
   wherein the test device can be scanned by the MRI scanner using the DTI sequence to generate the tissue baseline model for use in diagnosing disease in the tissue.

2. The device of claim 1, wherein the array has a generally polygonal shape.

3. The device of claim 2, wherein each of the arrays has a polygonal shape and the arrays are stacked in a tessellated arrangement.

4. The device of claim 1, wherein the plurality of arrays are stacked such that the capillary axes of the plurality of rows are generally parallel.

5. The device of claim 1, wherein the plurality of arrays are stacked such that the capillary axes of the adjacent rows are generally perpendicular.

6. The device of claim 1, wherein the first fluid, the second fluid, or both include a dopant.

7. The device of claim 1, wherein a first one of the arrays includes capillaries having a first inner diameter and a second one of the arrays includes capillaries having a second inner diameter that is smaller than the first inner diameter.

8. A method for obtaining a baseline model of human or animal tissue using a magnetic resonance imaging (MRI) scanner and a diffusion tensor imaging (DTI) sequence, comprising:

scanning with the MRI scanner a test object having a plurality of anisotropic structures by applying at least one diffusion gradient along a first direction according to the DTI sequence;
acquiring data from the scan; and
calculating the apparent diffusion coefficient distribution by reconstructing the data based on an assumption that the at least one diffusion gradient was applied along a second direction that is different than the first direction to generate the tissue baseline model.

9. A method for use in diagnosing disease in human or animal tissue using a magnetic resonance imaging (MRI) scanner and a diffusion tensor imaging (DTI) sequence, comprising:
scanning with the MRI scanner a test object having a plurality of anisotropic structures by applying at least one diffusion gradient along a first direction according to the DTI sequence;
acquiring data from the scan of the test object;
calculating the apparent diffusion coefficient distribution by reconstructing the data based on an assumption that the at least one diffusion gradient was applied along a second direction different than the first direction to generate a baseline model of the tissue;
scanning with the MRI scanner the tissue by applying at least one diffusion gradient along the first direction according to the DTI sequence;
acquiring data from the scan of the tissue;
calculating the apparent diffusion coefficient distribution of the tissue by reconstructing the data based on an assumption that the at least one diffusion gradient was applied along the second direction; and
comparing the calculation of the apparent diffusion coefficient distribution of the tissue baseline model with the calculation of the apparent diffusion coefficient distribution of the tissue.

10. A non-transitory computer-readable medium storing instructions that, when executed on a programmed processor, carry out a method for use in diagnosing disease in human or animal tissue using a magnetic resonance imaging (MRI) scanner and a diffusion tensor imaging (DTI) sequence, comprising:
instructions for scanning with the MRI scanner a test object having a plurality of anisotropic structures by applying at least one diffusion gradient along a first direction according to the DTI sequence;
instructions for acquiring data from the scan of the test object;
instructions for calculating the apparent diffusion coefficient distribution by reconstructing the data based on an assumption that the at least one diffusion gradient was applied along a second direction different than the first direction to generate a baseline model of the tissue;
instructions for scanning with the MRI scanner the tissue by applying at least one diffusion gradient along the first direction according to the DTI sequence;
instructions for acquiring data from the scan of the tissue;
instructions for calculating the apparent diffusion coefficient distribution of the tissue by reconstructing the data based on an assumption that the at least one diffusion gradient was applied along the second direction; and
instructions for comparing the calculation of the apparent diffusion coefficient distribution of the tissue baseline model with the calculation of the apparent diffusion coefficient distribution of the tissue.

11. A medical test object for use with a magnetic resonance imaging (MRI) scanner using a diffusion tensor imaging (DTI) sequence to generate a baseline model of human or animal tissue, comprising:
a housing; and
a matrix of compartments arranged in a plurality of rows and columns and housed within the housing, wherein at least two adjacent compartments of the matrix each include a plurality of fluid-filled capillary arrays formed into a macro-array, and wherein the macro-array of a first one of the adjacent compartments includes capillaries having a first inner diameter and the macro-array of a second one of the adjacent compartments includes capillaries having a second inner diameter that is different from the first inner diameter,
wherein the test device can be scanned by the MRI scanner using the DTI sequence to generate the tissue baseline model for use in diagnosing disease in the tissue.

12. The test object of claim 11, wherein the compartments of the matrix are each fluid-filled and wherein the fluid of at least one compartment comprises water and the fluid of the adjacent compartment comprises a mixture of water and a dopant.

13. The test object of claim 11, wherein the housing comprises at least one fiducial for aiding in the alignment of the test object within an imaging plane of the MRI scanner.

14. The test object of claim 11, wherein the housing is wrapped with thermal insulative material for maintaining the test object at a constant temperature.

15. The test object of claim 11, further comprising a second matrix of fluid-filled compartments arranged in a plurality of rows and columns and housed within the housing, wherein at least two adjacent fluid-filled compartments include differing dopant concentrations, and the compartments are free of any of the macro-arrays of arrays of capillaries.

16. The test object of claim 11, further comprising
a second housing encasing a matrix of compartments arranged in a plurality of rows and columns and housed within the housing, wherein the compartments of the matrix include liquid and/or a plurality of fluid-filled capillary arrays and wherein the second housing is configured to mate with the first housing.

17. A system for generating a baseline model of human or animal tissue using a magnetic resonance imaging (MRI) scanner and a diffusion tensor imaging (DTI) sequence, comprising:
an MRI scanner; and
the test object of claim 11 for scanning with the MRI scanner to generate the baseline model.

18. The test object of claim 11, wherein the compartments of the matrix are each fluid-filled, the fluid of at least one row of the compartments comprises water, the fluid of the other rows of compartments comprises a mixture of water and a dopant, all of the compartments in any one of the doped rows has the same amount of the dopant, and the rows of doped compartments each have differing amounts of the dopant.

19. The test object of claim 18, wherein all of the capillaries of the macro-arrays of the compartments of a first one of the columns has the first inner diameter, all of the capillaries of the macro-arrays of the compartments of a second one of the columns has the second inner diameter, and the second inner diameter is smaller than the first inner diameter.

20. The test object of claim 18, further comprising a second matrix of fluid-filled compartments arranged in a plurality of rows and columns and housed within the housing, wherein the compartments of the second matrix are free of any of the macro-arrays of arrays of capillaries, correspond by row and column to the compartments of the first matrix, and include water and a dopant in the same concentrations as in the corresponding compartments of the first matrix.

* * * * *